(12) United States Patent
Kitada

(10) Patent No.: US 9,496,279 B2
(45) Date of Patent: Nov. 15, 2016

(54) COMPOSITE SUBSTRATE

(71) Applicant: KYOCERA CORPORATION, Kyoto (JP)

(72) Inventor: Masanobu Kitada, Kyoto (JP)

(73) Assignee: Kyocera Corporation, Kyoto (JP)

(*) Notice: Subject to any disclaimer, the term of this patent is extended or adjusted under 35 U.S.C. 154(b) by 87 days.

(21) Appl. No.: 14/382,220

(22) PCT Filed: Feb. 28, 2013

(86) PCT No.: PCT/JP2013/055405
§ 371 (c)(1),
(2) Date: Aug. 29, 2014

(87) PCT Pub. No.: WO2013/129572
PCT Pub. Date: Sep. 6, 2013

(65) Prior Publication Data
US 2015/0155299 A1 Jun. 4, 2015

(30) Foreign Application Priority Data

Feb. 29, 2012 (JP) ................. 2012-042888
Feb. 29, 2012 (JP) ................. 2012-043792
(Continued)

(51) Int. Cl.
*H01L 27/12* (2006.01)
*H01L 21/20* (2006.01)
(Continued)

(52) U.S. Cl.
CPC ....... *H01L 27/1203* (2013.01); *H01L 21/0242* (2013.01); *H01L 21/0245* (2013.01);
(Continued)

(58) Field of Classification Search
CPC .......... H01L 21/2007; H01L 21/02491; H01L 21/0245; H01L 21/02488; H01L
(Continued)

(56) References Cited

U.S. PATENT DOCUMENTS 6,194,742 B1  2/2001 Kern et al.
2002/0168837 A1  11/2002 Hsu et al.
(Continued)

FOREIGN PATENT DOCUMENTS

EP  1858071 A1  11/2007
JP  2003-031781 A  1/2003
(Continued)

OTHER PUBLICATIONS

Extended European Search Report in European Patent Application No. EP 13754726.1, dated Aug. 28, 2015, in 9 pages.

*Primary Examiner* — Jonathan Langman
(74) *Attorney, Agent, or Firm* — Duane Morris LLP

(57) ABSTRACT

Provided is a composite substrate having a semiconductor layer wherein diffusion of a metal is suppressed. This composite substrate has: a single crystal supporting substrate composed of an insulating oxide; a semiconductor layer, which has one main surface overlapping the supporting substrate, and which is composed of a single crystal; and a polycrystalline or amorphous intermediate layer, which is positioned between the supporting substrate and the semiconductor layer, and which has, as a main component, an element constituting the supporting substrate or an element constituting the semiconductor layer, and in which the ratio of accessory components other than the main component is less than 1 mass %.

11 Claims, 14 Drawing Sheets

(30) Foreign Application Priority Data

| | | |
|---|---|---|
| Mar. 29, 2012 | (JP) | 2012-077026 |
| Apr. 27, 2012 | (JP) | 2012-102722 |
| Sep. 7, 2012 | (JP) | 2012-197639 |
| Sep. 7, 2012 | (JP) | 2012-197641 |
| Sep. 7, 2012 | (JP) | 2012-197642 |

(51) Int. Cl.
    *H01L 29/786*      (2006.01)
    *H01L 21/02*      (2006.01)

(52) U.S. Cl.
    CPC ... *H01L 21/02488* (2013.01); *H01L 21/02491* (2013.01); *H01L 21/2007* (2013.01); *H01L 29/78603* (2013.01); *H01L 29/78606* (2013.01); *H01L 29/78654* (2013.01); *H01L 21/02502* (2013.01); *H01L 21/02505* (2013.01)

(58) Field of Classification Search
    CPC ............ 21/0242;H01L 21/02502; H01L 21/02505; H01L 29/78603; H01L 29/78606; H01L 29/78654; H01L 27/1203
    See application file for complete search history.

(56) References Cited

U.S. PATENT DOCUMENTS

| | | |
|---|---|---|
| 2004/0229579 A1 | 11/2004 | Tsutsui et al. |
| 2006/0051554 A1 | 3/2006 | Kumakura et al. |
| 2008/0286937 A1 | 11/2008 | Mitani |
| 2009/0289332 A1* | 11/2009 | Boussagol et al. ........... 257/618 |
| 2010/0244182 A1 | 9/2010 | Akiyama et al. |
| 2012/0126362 A1 | 5/2012 | Akiyama et al. |
| 2012/0193636 A1* | 8/2012 | Stern ............................... 257/76 |
| 2013/0288453 A1 | 10/2013 | Akiyama et al. |
| 2013/0309843 A1 | 11/2013 | Akiyama et al. |

FOREIGN PATENT DOCUMENTS

| | | |
|---|---|---|
| JP | 2004-343369 A | 12/2004 |
| JP | 2006-005127 A | 1/2006 |
| JP | 2010-186992 A | 8/2010 |
| JP | 2010-278338 A | 12/2010 |
| JP | 2012-019125 | 1/2012 |
| WO | WO-2010/137589 A1 | 12/2010 |

* cited by examiner (a)

(b)

(a)

(b)

(c)

(a)

(b)

(a)

(b)

(c)

(a)

(b)

(c)

(a)

(b)

(a)

(b)

(c)

(a)

(b)

(c)

(a)

(b)

(c)

(a)

(b)

(a)

(b)

COMPOSITE SUBSTRATE

RELATED APPLICATION

This application claims priority under 35 U.S.C. §119 to International Application Number PCT/JP2013/055405, filed on Feb. 28, 2013, which claims priority to Japanese Patent Application No. 2012-043792, filed on Feb. 29, 2012, and Japanese Patent Application No. 2012-042888, filed on Feb. 29, 2012, and Japanese Patent Application No. 2012-077026 filed on Mar. 29, 2012, and Japanese Patent Application No. 2012-102722, filed on Apr. 27, 2012, and Japanese Patent Application No. 2012-1976369, filed on Sep. 7, 2012, and Japanese Patent Application No. 2012-197641, filed on Sep. 7, 2012, and Japanese Patent Application No. 2012-197642, filed on Sep. 7, 2012. The content of which is incorporated by reference herein in its entirety.

TECHNICAL FIELD

The present invention relates to a composite substrate having a semiconductor layer.

BACKGROUND ART

In recent years, a technique which is supposed to improve performance of a semiconductor device and to reduce parasitic capacitance has been developed. As the technique to reduce the parasitic capacitance, there is a silicon on sapphire (SOS) structure. As a method of forming the SOS structure, there is a technique disclosed in Japanese Unexamined Patent Application Publication No. 2003-31781, for example. In addition, as a method of bonding a substrate made of a different material, there is a technique described in Japanese Unexamined Patent Application Publication No. 2004-343369, for example.

SUMMARY OF INVENTION

However, in the technique disclosed in Japanese Unexamined Patent Application Publication No. 2003-31781, there is a concern that a significantly small amount of metal contained in sapphire diffuses to a silicon which is a functional layer of a semiconductor device, and an operation of the semiconductor device is adversely influenced. In addition, in the technique disclosed in Japanese Unexamined Patent Application Publication No. 2004-343369, there is a concern that floated metals in a chamber of a bonding apparatus are incorporated into a bonding interface when a bonding surface is irradiated with an ion beam or a neutron beam in order to activate the bonding surface. For this reason, even if the technique described in Japanese Unexamined Patent Application Publication No. 2004-343369 is employed when an SOS structure is formed, there is a concern that the metal diffuses to the side of silicon, which is the functional layer of the semiconductor device, and the operation of the semiconductor device is adversely influenced.

For this reason, a composite substrate having a semiconductor layer in which incorporation of a metal is suppressed, is required.

According to the present invention, a composite substrate includes a supporting substrate, a semiconductor layer, and an intermediate layer. The supporting substrate is composed of a single crystal of an insulating oxide. The semiconductor layer is composed of a single crystal and bonded to the supporting substrate such that a main surface of the semiconductor layer faces to the supporting substrate. The intermediate layer is disposed between the supporting substrate and the semiconductor layer. The intermediate layer includes a main component that is an element contained in the supporting substrate or the semiconductor layer and a sub-component, which is other than the main component, that is less than 1 mass %. The intermediate layer is composed of a polycrystal or an amorphous material.

According to the invention, it is possible to provide a composite substrate which suppresses the diffusion of the metal to the semiconductor layer.

DESCRIPTION OF EMBODIMENTS

Figure 1:
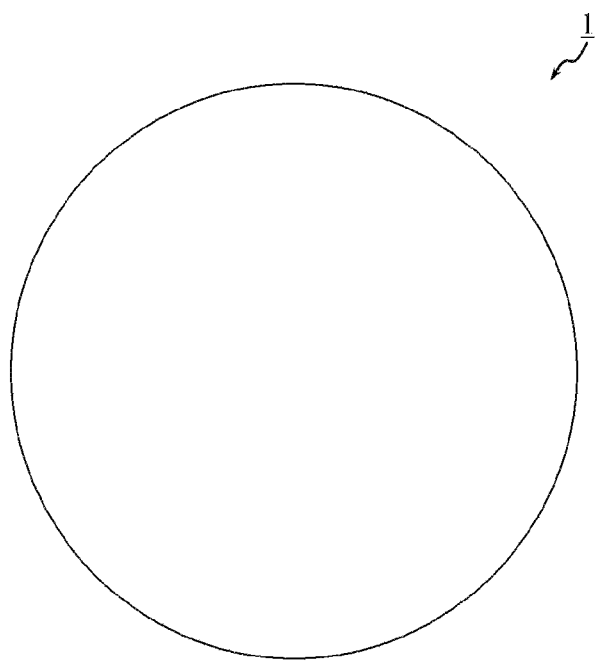
FIG. 1(a) is a plan view illustrating a schematic configuration of a composite substrate according to one embodiment of the invention.
FIG. 1(b) is a partial cross-sectional view in which the composite substrate is obliquely viewed.
Figure 1:
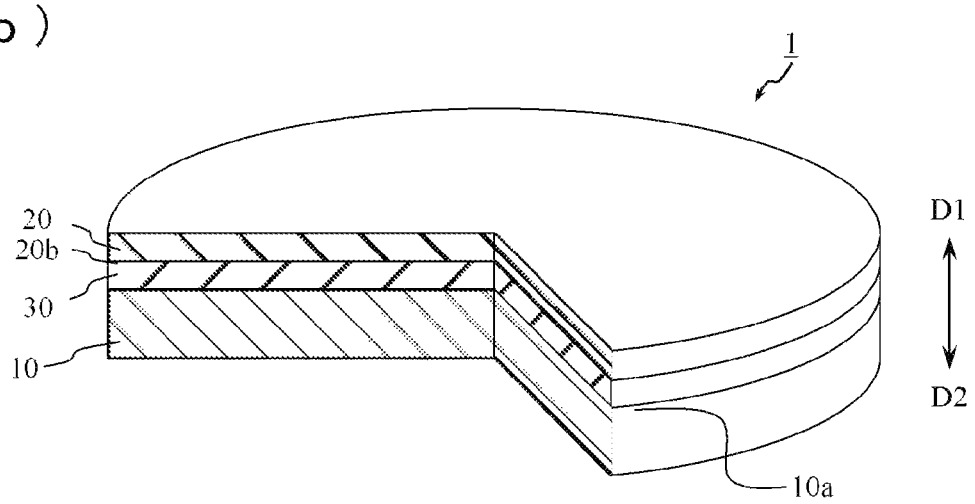

As illustrated in FIG. 1, a composite substrate 1 according to the invention includes a supporting substrate 10, a semiconductor layer 20, and an intermediate layer 30. The intermediate layer 30 is disposed between the supporting substrate 10 and the semiconductor layer 20. Here, the intermediate layer 30 includes an element contained in the supporting substrate 10 or the semiconductor layer 20 as a main component. An existence amount of a sub-component other than a main component is equal to or less than 1 mass %. In other words, the intermediate layer 30 has significantly high purity, and is different from a so-called glass material.

The positional relationship between the supporting substrate 10, the intermediate layer 30, and the semiconductor layer 20 is common in first to fourth embodiments described below.

In addition, in the description below, in modification examples of each constituent element, capital letters are added after reference numerals of the constituent elements. The common contents of each modification example are described without adding the capital letters.

First Embodiment

An example of the embodiment of the composite substrate of the invention will be described with reference to the drawings. A composite substrate 1A of the invention is configured to include a supporting substrate 10A, the semiconductor layer 20, and an intermediate layer 30A.

The supporting substrate 10A may support the semiconductor layer 20 which is disposed at an upper portion thereof, may include a desired strength and a desired flatness of a surface, and may contain oxygen. As a material contained in the supporting substrate 10A, it is possible to use an aluminum oxide single crystal (sapphire), quartz, a resin substrate, or the like. It can be freely select crystallinity or the like of the supporting substrate 10A, but the embodiment employs a single crystal sapphire as the supporting substrate 10A.

Examples of a thickness of the supporting substrate 10A include a range of 400 [m] to 800 [m].

The semiconductor layer 20 is bonded to the supporting substrate 10A such that a main surface 20b faces to a main surface 10a. As a material of the semiconductor layer 20, a single crystal semiconductor material may be used, for example, it is possible to use Si, Ge, GaAs, ZnTe, GaN, an organic semiconductor single crystal, or the like. In the embodiment, an Si single crystal is used as the semiconductor layer 20.

Examples of a thickness of the semiconductor layer 20 include a range of 30 [nm] to 200 [nm]. In addition, an example of dopant concentration of the semiconductor layer 20 includes concentrations of p– and n–, which mean relatively low concentrations, and non-doped, and the semiconductor layer 20 is formed to be any one of those described above. Examples of the concentration of p– include a range which is equal to or less than $1\times10^{16}$ [atoms/cm$^3$]. Examples of the concentration of n– include a range which is equal to or less than $5\times10^{15}$ [atoms/cm$^3$]. Here, a "non-doped silicon" is a silicon which is not doped, simply intending impurities, and is not limited to an intrinsic silicon which does not include the impurities. It is preferable that the oxygen concentration in the semiconductor layer 20 be equal to or less than the oxygen concentration of an interface of the semiconductor layer 20 side of the intermediate layer 30 which will be described later. The oxygen concentration will be described in detail, but may be less than $1\times10^{18}$ [atoms/cm$^3$].

The intermediate layer 30A is disposed between the supporting substrate 10 and the semiconductor layer 20. One main surface of the intermediate layer 30A is directly bonded to the supporting substrate 10A, and the other main surface is directly bonded to the semiconductor layer 20.

The intermediate layer 30A is in a state where a crystal structure of both of the supporting substrate 10A and the semiconductor layer 20 is disturbed. In other words, an element of a main component contained in the supporting substrate 10A, that is, alumina, and an element contained in the semiconductor layer 20, that is, Si, both exist individually as elemental substances. In other words, the element contained in the supporting substrate 10A and the element contained in the semiconductor layer 20 are not chemically combined. In addition, since the intermediate layer 30A contains the element of the main component contained in the supporting substrate 10A, the intermediate layer 30A contains oxygen on the inside thereof.

The interface between the intermediate layer 30A and supporting substrate 10A can be determined by a difference in the crystal structure. In other words, the supporting substrate 10A is present up to an area which is the single crystal, and the intermediate layer 30A is present from an area in which the crystal structure is disturbed. The interface between the intermediate layer 30A and the semiconductor layer 20 can also be similarly determined.

In other words, the crystallinity of the intermediate layer 30A is low compared to that of the supporting substrate 10A and the semiconductor layer 20. In the example, the intermediate layer 30A is composed of a pseudo-polycrystal made of two types of crystal structures which is different from the single crystal and in which the crystal structure that constitutes the supporting substrate 10A and the crystal structure that constitutes the semiconductor layer 20 are mixed. The difference in the crystallinity may be recognized by observing with a transmission electron microscope (TEM), for example, after forming cross-section with focusing ion beam (FIB) processing, or by performing electron beam diffraction. In addition, the difference may be measured by Rutherford backscattering (RBS).

According to this configuration, even when the element contained in the supporting substrate 10A and the element contained in the semiconductor layer 20 are not chemically combined, it is possible to bond the supporting substrate 10A and the semiconductor layer 20 to each other. In addition, any of the element contained in the supporting substrate 10A and the element contained in the semiconductor layer 20 is not combined with an element other than the element contained in the supporting substrate 10A and the element contained in the semiconductor layer 20. According to this, a combining method is different from a general method of combining both of these via a bonding layer.

In a thickness direction, the intermediate layer 30A includes an oxygen concentration distribution in which the oxygen concentration decreases as the intermediate layer 30A approaches the semiconductor layer 20. A state of the oxygen concentration distribution in the intermediate layer 30A is not particularly limited, but may be inclined to be the same as the oxygen concentration of the semiconductor layer 20 in the interface between the semiconductor layer 20 and the intermediate layer 30A. In addition, it is preferable that the thickness of the intermediate layer 30A be equal to or less than 50 [nm]. More preferably, the thickness of the intermediate layer 30A is 5 [nm] to 10 [nm]. This is because parasitic capacitance or heat conduction is not adversely influenced, even in a case of a layer other than the single crystal, for example, a layer including oxygen, by having such a thickness described above.

As the composite substrate 1A is configured in this manner, it is possible to suppress the diffusion and the deposition of the impurities to the semiconductor layer 20.

Hereinafter, the reason thereof will be described.

In the composite substrate 1A, there is a concern that the impurities, such as a metal, are incorporated into the bonding interface when the supporting substrate 10A and the semiconductor layer 20 are bonded to each other, and the impurities, such as the metal, which are contained in an significantly small amount to the supporting substrate 10A, diffused to the semiconductor layer 20 and are deposited. There is a concern that the presence of the metal causes an occurrence of a malfunction when an element function portion which functions as the semiconductor device is configured in the semiconductor layer 20. Here, for example, even when the impurities, such as the metal, exist, it is important to prevent the diffusion and the deposition to the semiconductor layer 20.

In contrast, the intermediate layer 30A is provided on the composite substrate 1A. Compared to a combining energy of combining with the element contained in the semiconductor layer 20, the metal has less combining energy of combining with oxygen. For example, when Si and Fe contained in the semiconductor layer 20 are taken as an example, a eutectic temperature of Si—Fe is 660[° C.]. While heating is required in the combination, the combination of Fe—O is processed even at a room temperature. For this reason, the metal does not diffuse to the semiconductor layer 20, combines with oxygen of the intermediate layer 30A, and is maintained inside the intermediate layer 30A. Furthermore, since the oxygen concentration of the intermediate layer 30A decreases as approaching the semiconductor layer 20, it is possible to maintain the metal on the supporting substrate 10A in the thickness direction of the intermediate layer 30A without leaving the metal on the interface between the semiconductor layer 20 and the intermediate layer 30A.

In addition, while the crystal structure of the intermediate layer 30A is disturbed, the semiconductor layer 20 is the single crystal, and from this point of view, it is possible to incorporate the metal into the intermediate layer 30A in which the diffusion and the solid dissolution easily occur.

Furthermore, the oxygen concentration of the semiconductor layer 20 is less than $1 \times 10^{18}$ [atoms/cm$^3$]. According to this configuration, the diffusion, the solid dissolution, and the deposition of the metal to the semiconductor layer 20 are suppressed. In particular, when the metal is Fe, it is possible to suppress the occurrence of an OSF defect.

In the intermediate layer 30A, it is preferable that the oxygen concentration decrease as the intermediate layer 30A approaches the semiconductor layer 20 from a side which is in contact with the supporting substrate 10A, and the oxygen concentration be the same level as that of the semiconductor layer 20 on a surface of a side which is in contact with the semiconductor layer 20. Even in this configuration, it is possible to reliably suppress the OSF defect without supplying oxygen to the semiconductor layer 20 from the intermediate layer 30A.

As described above, according to the composite substrate 1, it is possible to provide a semiconductor layer 20 having a high quality in which the diffusion of the impurities, such as the metal, to the semiconductor layer 20 is suppressed.

Modification Example of First Embodiment

Instead of the above-described intermediate layer 30A, an intermediate layer 30B which further contains metallic atoms existing as an elemental substance may be used.

Examples of the metallic atoms can include Fe, Cr, Ni, Cu, Zn, or the like. However, the element of the main component contained in the supporting substrate 10A and the semiconductor layer 20 is excluded. The content may be less than $1 \times 10^{15}$ [atoms/cm$^2$], for example. It is important that the metallic element is contained as an elemental substance. In other words, it is important that the metallic element is not combined with the element contained in the supporting substrate 10A and the semiconductor layer 20, and is maintained as an elemental substance in a defective area where the crystal of the element contained in the supporting substrate 10A and semiconductor layer 20 is disturbed.

According to this configuration, since the metallic element is not directly related to the combination, the metallic element does not exist in a layer shape on the interface of the semiconductor layer 20 side. As a result, it is possible to suppress the diffusion to the semiconductor layer 20. In addition, even when the metallic atoms cause a new reaction or the diffusion due to a heat treatment for forming the semiconductor device, it is possible to suppress the exfoliation of the semiconductor layer 20, and to enhance the reliability, without influencing the combining strength. Furthermore, as the metallic element exists as an elemental substance inside the intermediate layer 30B, it is possible to keep the new reaction and a phenomenon, such as the diffusion, inside the intermediate layer 30B even when the heat treatment or the like for forming the semiconductor device is performed. In other words, since the oxygen concentration of the intermediate layer 30B in the thickness direction increases over the supporting substrate 10A in the configuration, the metallic element can be moved to the supporting substrate 10A by the following heat treatment or the like. In addition, in the intermediate layer 30B, it is preferable that the concentration of the metallic element be distributed in the thickness direction, and the concentration decrease from the supporting substrate 10A.

In this manner, according to the composite substrate 1A, it is possible to achieve a good reliability without deteriorating a characteristic of the semiconductor layer 20 even with respect to the following heat treatment.

In addition, as the metallic element is not combined with the supporting substrate 10A and the semiconductor layer 20, even if a distortion due to a heat history or the like added to the composite substrate 1A occurs, the metallic element can move to mitigate the distortion.

Manufacturing Method of Composite Substrate 1A According to First Embodiment

Next, a manufacturing method of the composite substrate 1A will be described with reference to the drawings.

First, as illustrated in FIG. 2(a), a first substrate 20X formed of silicon (Si) is prepared. The first substrate 20X is made by forming an Si film 20Xb which epitaxially grows Si on an upper surface (D2 direction in the drawing) of the single crystal silicon substrate 20Xa. A part of the Si film 20Xb later becomes semiconductor layer 20. As the epitaxial growth method, it is possible to employ various methods, such as a heat chemical vapor deposition method (heat CVD method) which passes into, thermally decomposes, and grows a gaseous silicon compound on a surface of the single crystal silicon substrate 20Xa, while heating the single crystal silicon substrate 20Xa. Since the Si film 20Xb is epitaxially grown on the silicon substrate, it is possible to reduce a lattice defect compared to in a case where the Si film 20Xb is epitaxially grown on the sapphire substrate. In addition, since the film is epitaxially grown in a vacuum, it is possible to suppress the oxygen content in the film to be significantly low compared to in the silicon substrate formed by a CZ method. More particularly, it is possible to make the oxygen concentration to be less than $10^{18}$ [atoms/cm$^3$]. The oxygen concentration is a value which is equal to or less than 1/10 compared to in the silicon substrate formed by the CZ method. Practically, it is verified that the oxygen concentration can be less than $3\times10^{17}$ [atoms/cm$^3$].

Here, the dopant concentration of the Si film 20Xb is not particularly limited, but for example, is the p-type dopant concentration and the n-type dopant concentration which are relatively low concentrations, and the film is formed to be any one of non-doped films. Examples of the p-type dopant concentration include a range which is equal to or less than $1\times10^{16}$ [atoms/cm$^3$]. Examples of the n-type dopant concentration include a range which is equal to or less than $5\times10^{15}$ [atoms/cm$^3$]. The dopant concentration of the Si film 20Xb decreases from the single crystal silicon substrate 20Xa, and becomes the dopant concentration which is a completely depleted layer on the surface of a side opposite to the side which is in contact with the single crystal silicon substrate 20Xa.

In addition, although not particularly limited, it is preferable that the thickness of the Si film 20Xb be approximately 2 [μm], for example.

Figure 2:
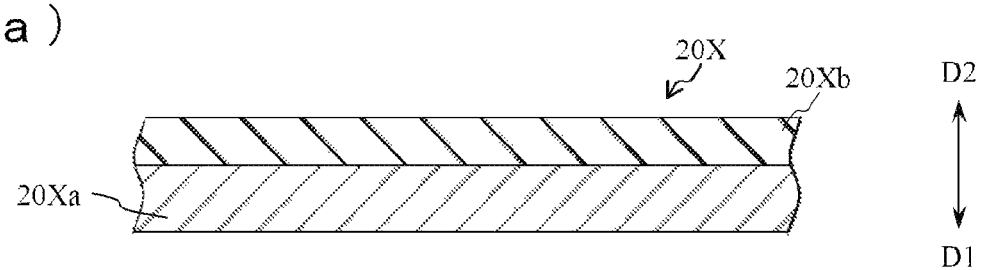
FIGS. 2(a) to 2(c) are cross-sectional views illustrating an example of a manufacturing process of a manufacturing method of a composite substrate 1A.
Figure 2:
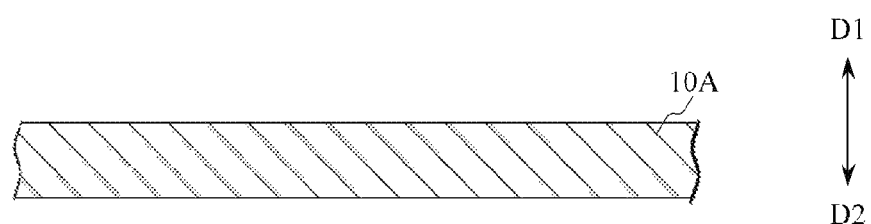
Figure 2:
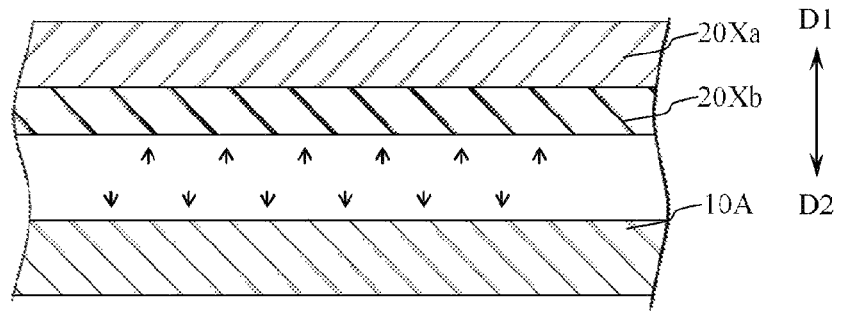

Next, as illustrated in FIG. 2(*b*), the insulating supporting substrate 10A which is composed of the aluminum oxide single crystal (sapphire) is prepared.

Next, the supporting substrate 10A and a main surface (main surface which is positioned on a side opposite to the single crystal silicon substrate 20Xa) of the first substrate 20X in a D1 direction are bonded to each other. In other words, the supporting substrate 10A and the main surface of the Si film 20Xb are bonded to each other. Examples of a method of bonding, as illustrated in FIG. 2(*c*), include a method of bonding by activating the surface of the bonded surface, and a method of bonding by using an electrostatic force. Examples of a method of activating the surface include a method of activating by irradiating the surface with the ion beam or the neutron beam in a vacuum and etching the surface, and a method of activating by etching the surface by a chemical solution.

Figure 3:
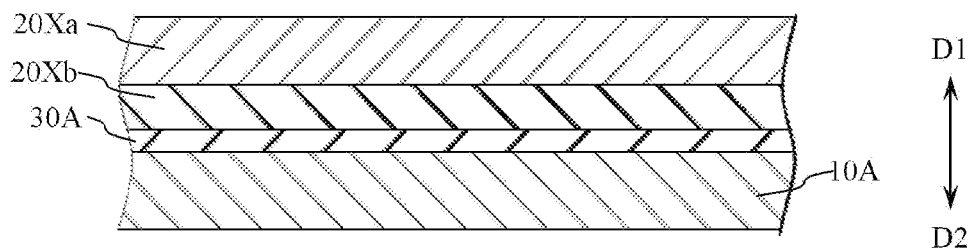
FIGS. 3(a) and 3(b) are cross-sectional views illustrating a manufacturing process after FIG. 2.
Figure 3:
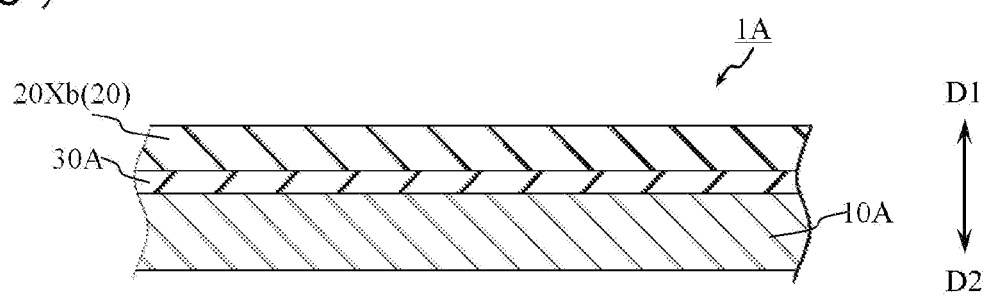

As illustrated in FIG. 3(*a*), by applying a pressure in an activated state, it is possible to form the intermediate layer 30A in a state where a crystal of a part of the interface between the supporting substrate 10A and the Si film 20Xb is disturbed. By adjusting an extent and an aggravation of the activation of the surface by the output of the ion beam and the neutron beam, it is possible to control the thickness of the intermediate layer 30A, the ratio of the element contained in the supporting substrate 10A, and the ratio of the element contained in the Si film 20Xb. Here, the metal is prevented from being floated in a bonding apparatus so that the metal is not interposed as the bonding layer on the bonding surface. For example, a metal generating source is covered by a cover member which is made of ceramic, the inside of the bonding apparatus is cleaned, or a degree of vacuum is ensured. The bonding may be performed at a room temperature. In addition, the bonding is performed by a method in which an adhesive, such as a resin-based adhesive, is not used.

In addition, without heating during the bonding, it is possible to suppress the formation of the unintended combination between each element since the metal which is only for forming the bonding layer also does not exist.

In a case of the bonding by the bonding method, it is preferable that the Si film 20Xb and the supporting substrate 10A have small surface roughness of the surface to be bonded. The surface roughness is represented by an arithmetic average roughness Ra or a root mean square Rq, for example. Examples of a range of the arithmetic average roughness Ra include a range which is less than 10 [nm]. Examples of a range of the root mean square Rq include a range which is less than 5 [nm]. As the arithmetic average roughness Ra and the root mean square Rq are small, it is possible to decrease the pressure applied when the Si film 20Xb and the supporting substrate 10A are bonded to each other.

As the process proceeds up to here, it is possible to make an intermediate product having the intermediate layer 30A and the Si film 20Xb between the supporting substrate 10A and the single crystal silicon substrate 20Xa.

Next, the intermediate product is processed from the arrow D1 direction side (single crystal silicon substrate 20Xa side), and the Si film 20Xb is exposed by removing the single crystal silicon substrate 20Xa as illustrated in FIG. 3(*b*). As a processing method of removing the single crystal silicon substrate 20Xa, for example, it is possible to employ various methods, such as an abrasive grain polishing, a chemical etching, or an ion beam etching, and a plurality of methods may be combined. At this time, a part of the Si film 20Xb may be removed in the thickness direction together with the single crystal silicon substrate 20Xa.

Here, it is preferable that the single crystal silicon substrate 20Xa be removed by using a substrate having a high dopant concentration as the single crystal silicon substrate 20Xa, and by using an etchant in which an etching rate in the dopant concentration of the single crystal silicon substrate 20Xa and an etching rate in the dopant concentration of the Si film 20Xb are largely different from each other. This is because, in this case, productivity can increase, and the Si film 20Xb can remain on the surface of the main surface 10a of the supporting substrate 10 with a uniform thickness, for example, even when a wave of the supporting substrate 10 is large.

In other words, it is possible to perform processing with a uniform thickness along the wave of the supporting substrate 10.

By precisely polishing the upper surface of the Si film 20Xb in the D1 direction, it is possible to improve the uniformity of the thickness. Examples of etching means which is used in the precise etching include a dry etching. Examples of the dry etching include an etching according to a chemical reaction and an etching according to a physical collision. Examples of the etching which uses the chemical reaction include an etching which uses reactive gas, a reactive ion and ion beam, and a reactive radical, or the like. Examples of the etching gas which is used in the reactive ion include sulfur hexafluoride (SF6) or carbon tetrafluoride (CF4). In addition, examples of the physical collision include an etching which uses the ion beam. Examples of the etching which uses the ion beam include a method of using a gas cluster ion beam (GCIB). While etching a narrow area by using the etching means, it is possible to perform the precise etching well even in a case of a base material substrate having a large area, by scanning the substrate in a movable stage.

A remaining part of the Si film 20Xb after proceeding the process is considered as the semiconductor layer 20. As the entire process proceeds in this manner, it is possible to obtain the composite substrate 1A which is stacked in an order of intermediate layer 30A and the semiconductor layer 20 on the supporting substrate 10A.

As the process proceeds in this manner, the surface of the supporting substrate 10A of the semiconductor layer 20 which is formed by the epitaxial growth becomes a non-doped depleted layer, and the oxygen concentration also decreases. In other words, the distortion of the surface of the supporting substrate 10A of the semiconductor layer 20 becomes significantly small. This configuration is preferable since a stress or the like is not applied by the unintended distortion on the surface of the bonding with the supporting substrate 10A.

Furthermore, on the composite substrate 1A which is formed as the above-described process proceeds, an SiOx layer (oxide layer) having a constant film thickness like an SOI substrate in the related art does not exist between the supporting substrate 10A and the semiconductor layer 20, particularly, on the semiconductor layer 20. In other words, the layer in which the oxygen is the main component and the semiconductor layer 20 are not in contact with each other, and it is possible to realize the bonding with the supporting substrate 10A. According to this, it is possible to suppress an occurrence of the unintended stress which is required to form the SiOx layer, and an occurrence of interstitial Si or the like, in the semiconductor layer 20, and to improve the quality of the semiconductor layer 20.

In the above-described process, although the process of cleaning the substrate or the like is not described, the substrate may be cleaned if necessary. Examples of a method of cleaning the substrate include various methods, such as cleaning by using an ultrasonic wave, cleaning by using an organic solvent, cleaning by using chemicals, and cleaning by using O2 ashing. These methods of cleaning may be combined with each other and used.

Second Embodiment

Next, a composite substrate 1C according to a second embodiment will be described. Compared to the composite substrates 1A and 1B, the composite substrate 1C is different in a supporting substrate 10C and an intermediate layer 30C. In addition, in the composite substrate 1C, the positional relationship between the supporting substrate 10C, the intermediate layer 30C, and the semiconductor layer 20 is the same as that between the supporting substrate 10, the intermediate layer 30, and the semiconductor layer 20 of the composite substrate 1, as illustrated in FIG. 1. Hereinafter, only the differences will be described, and the repeating description will be omitted.

The supporting substrate 10C supports the semiconductor layer 20 which is disposed on an upper portion thereof, and the single crystal having a strength and a flatness can be freely selected as the supporting substrate 10C. As a material contained in the supporting substrate 10C, it is possible to use the aluminum oxide single crystal (sapphire), a silicon carbide substrate, or the like. In the embodiment, the sapphire which is an insulating material is employed as the supporting substrate 10C.

Examples of a thickness of the supporting substrate 10C include a range from 400 [μm] to 800 [μm]. In addition, it is preferable that the arithmetic average roughness Ra of the supporting substrate 10C be equal to or less than 1 [nm].

The intermediate layer 30C is disposed between the supporting substrate 10C and the semiconductor layer 20. The intermediate layer 30C has an element contained in the supporting substrate 10C as the main component. For example, intermediate layer 30C has alumina as the main component. The crystallinity of the intermediate layer 30C is low compared to that of the supporting substrate 10C.

The intermediate layer 30C is composed of a polycrystal or an amorphous material. The thickness of the intermediate layer 30C is not particularly limited, but the maximum value of the thickness is set to be able to solid-dissolve the amount of the metal which causes a concern that the metal is incorporated by bonding the supporting substrate 10C and the semiconductor layer 20 to each other, which will be described later. However, a melting point of alumina is approximately 1800[° C.]. Even when the metal which will be described later exists on the interface between the intermediate layer 30C and the supporting substrate 10C, the metal does not react to the element contained in the intermediate layer 30C, or is not encouraged to diffuse. For this reason, the above-described maximum value of the thickness is not necessarily required. For example, the thickness may be approximately 50 [nm]. More preferably, the thickness may be equal to or less than 10 [nm].

One main surface of the intermediate layer 30C is directly bonded to the supporting substrate 10C, and the other main surface is directly bonded to the semiconductor layer 20. A boundary between the intermediate layer 30C and the supporting substrate 10C can be determined by the difference in the crystal structure. In other words, the supporting substrate 10C is present up to an area which is the single crystal, and the intermediate layer 30C is present from an area in which the crystal structure is disturbed.

As the composite substrate 1C is configured in this manner, it is possible to suppress the diffusion or the deposition of the impurities to the semiconductor layer 20. Hereinafter, the reason thereof will be described.

The intermediate layer 30C is provided on the composite substrate 1C. The intermediate layer 30C is configured by the same material-based element as the element contained in the supporting substrate 10C. In other words, the intermediate layer 30C is an alumina layer. The melting point of alumina is high, and alumina is not combined with the metal and does not encourage the diffusion of the metal even when the metal exists. For this reason, even when the metal exists on the interface between the supporting substrate 10C and the intermediate layer 30C, it is possible to maintain the metal between the supporting substrate 10C and the intermediate layer 30C, and as a result, it is possible to suppress the diffusion of the metal to the semiconductor layer 20.

In addition, the crystallinity of the intermediate layer 30C is low compared to that of the single crystal semiconductor layer 20 and the supporting substrate 10C. For this reason, even if the metal exists, the metal does not diffuse to the semiconductor layer 20, and the metal diffuses and is solid-dissolved to the intermediate layer 30C via a grain boundary or the like.

Here, the evaluation of the crystallinity of the intermediate layer 30C, may be conducted by observing by using the transmission electron microscope (TEM), for example, after the cross-section processing by the focusing ion beam (FIB) processing, and by performing the electron beam diffraction. In addition, the crystallinity may be measured by the Rutherford backscattering (RBS).

In addition, an oxygen amount per unit volume of the intermediate layer 30C is small compared to the supporting substrate 10C, and accordingly, it is possible to suppress the combination of the metal and the oxygen, and to suppress the movement according to the diffusion of the metal.

As described above, according to the composite substrate 1C, it is possible to suppress the diffusion of the impurities, such as the metal, to the semiconductor layer 20, and to provide the semiconductor layer 20 having a high quality.

Modification Example of Composite Substrate 1C: Intermediate Layer D

Instead of the above-described intermediate layer 30C, an intermediate layer 30D in which the crystal structure changes in the thickness direction may be used.

The intermediate layer 30D is composed of a polycrystal including alumina. A ratio of γ alumina increases while the intermediate layer 30D goes toward the supporting substrate 10C in the thickness direction, and a ratio of a alumina increases while the intermediate layer 30D goes toward the semiconductor layer 20.

As the two types of crystal structures are intermixed in the middle of the thickness of the intermediate layer 30D, it is possible that the middle of the thickness is in a state where the crystal structure is the most disturbed. Accordingly, if the metal exists, it is possible to maintain the metal by considering the middle of the thickness of the intermediate layer 30D as the center.

In addition, as the ratio of a alumina having a high temperature increases on the semiconductor layer 20 side, it is possible to effectively suppress the diffusion of the metal on the semiconductor layer 20.

Furthermore, when the sapphire on an R surface is used as the supporting substrate 10C, since the crystal structure which is exposed to one main surface of the supporting substrate 10C becomes close to a cubic crystal, preferably, a consistency with the intermediate layer 30D having a high proportion of γ alumina on the supporting substrate 10C side becomes good.

Modification Example of Composite Substrate: Intermediate Layer E

Instead of the above-described intermediate layer 30C, an intermediate layer 30E which further includes the metallic element may be used.

Examples of the metallic element can include Fe, Cr, Ni, Cu, Zn, or the like. However, the element of the main component contained in the supporting substrate 10 and the semiconductor layer 20 is excluded. The content may be less than $1 \times 10^{15}$ [atoms/cm$^3$], for example.

The concentration of the metallic element in the intermediate layer 30E decreases from the supporting substrate 10C toward the semiconductor layer 20 in the thickness direction. According to this configuration, it is possible to reliably prevent the metallic element from diffusing to the semiconductor layer 20.

Manufacturing Method of Composite Substrate 1C

Figure 4:
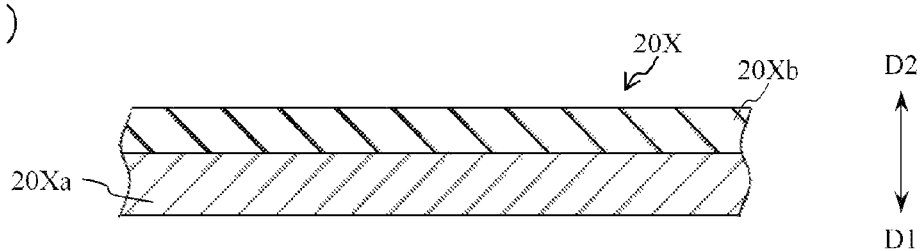
FIGS. 4(a) to 4(c) are cross-sectional views illustrating an example of a manufacturing process of a manufacturing method of a composite substrate 1C.
Figure 4:
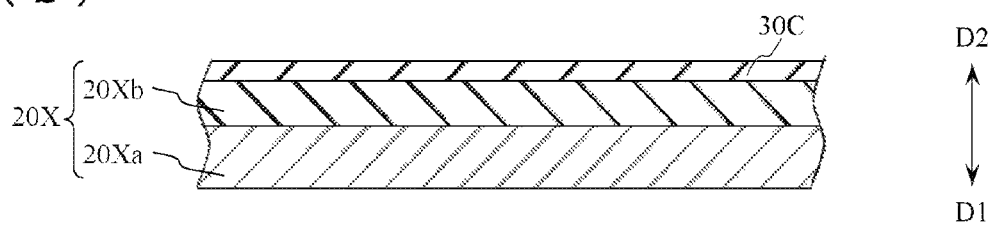
Figure 4:
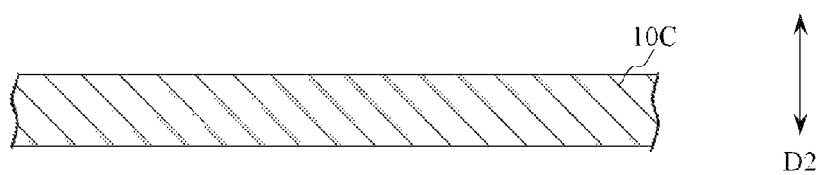
Figure 5:
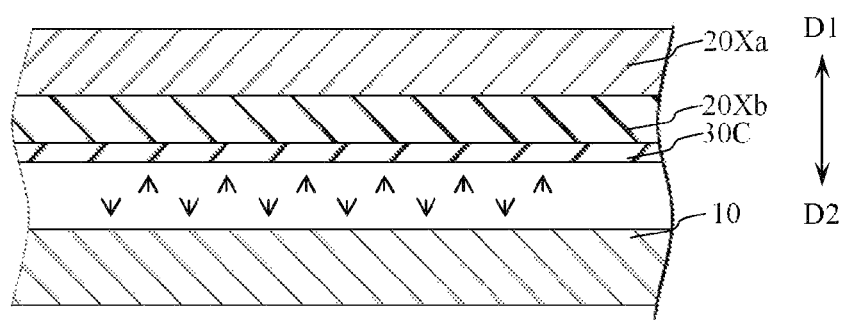
FIGS. 5(a) to 5(c) are cross-sectional views illustrating a manufacturing process after FIG. 4.
Figure 5:
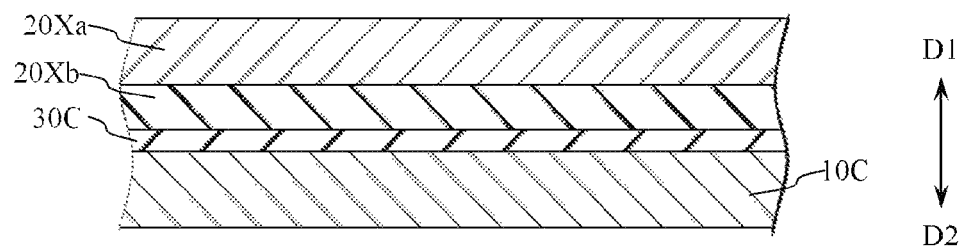
Figure 5:
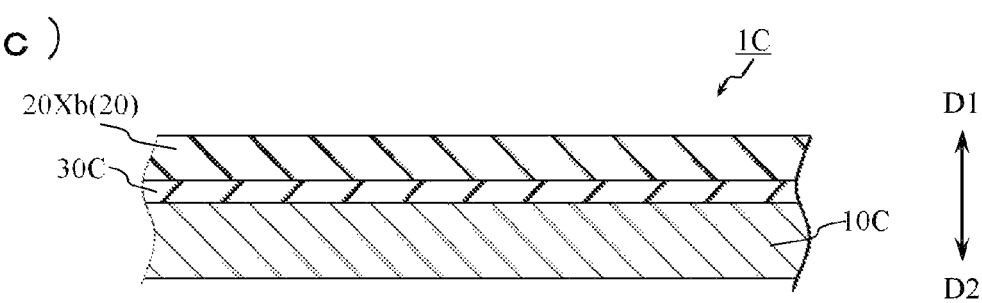

A manufacturing method of the composite substrate 1C will be described by using FIGS. 4 and 5.

First, as illustrated in FIG. 4(a), the first substrate 20X is prepared similarly to in FIG. 2(a).

Next, as illustrated in FIG. 4(b), the intermediate layer 30C which is made of alumina is formed on the upper surface of the Si film 20Xb in the D2 direction. The intermediate layer 30C may be formed, for example, by an atomic layer deposition (ALD) method, a CVD method, or a spattering method. In particular, the film is formed by the ALD method, the spattering method, or the like, which does not require the heating the substrate at a high temperature during the forming of the film. It is preferable that the upper limit of the specific film-forming temperature be a temperature which does not change the dopant concentration distribution in the Si film 20Xb, and be equal to or less than 500[° C.]. When the film is formed by the ALD method or the spattering method, since the substrate temperature is approximately from 200[° C.] to 400[° C.], the dopant concentration distribution does not change in the Si film 20Xb. The reason thereof will be described later, but it is preferable that the film is formed particularly by the ALD method.

Next, as illustrated in FIG. 4(c), the supporting substrate 10C is prepared similarly to in FIG. 2(b).

Next, the supporting substrate 10C and the main surface (main surface which is positioned on the side opposite to the single crystal silicon substrate 20Xa) of the first substrate 20X in the D2 direction are bonded to each other. In other words, the supporting substrate 10C and the main surface of the intermediate layer 30C are bonded to each other. Examples of a method of bonding, as illustrated in FIG. 5(a), include a method of bonding by activating the surface of the bonded surface, and a method of bonding by using the electrostatic force. Examples of a method of activating the surface include a method of activating by irradiating the surface with the ion beam or the neutron beam in a vacuum and etching the surface, and a method of activating by etching the surface by the chemical solution.

As illustrated in FIG. 5(b), both of these are bonded to each other in the activated state. The bonding may be performed at a room temperature. In addition, the bonding may be performed by a method in which the adhesive, such as the resin-based adhesive is not used.

When the bonding is performed by the method of bonding, it is preferable that the surface roughness of the surface to be bonded of the intermediate layer 30C and the supporting substrate 10C be small. The surface roughness is represented by the arithmetic average roughness Ra, for example. Examples of a range of the arithmetic average roughness Ra include a range which is less than 10 [nm]. As the arithmetic average roughness is small, it is possible to decrease the pressure applied during the bonding to each other.

As the process proceeds up to here, it is possible to make the intermediate product having the intermediate layer 30C and the Si film 20Xb between the supporting substrate 10C and the single crystal silicon substrate 20Xa.

Next, as illustrated in FIG. 5(c), similarly to in FIG. 3(b), the semiconductor layer 20 is obtained by making the first substrate 20X into a thin layer. As the entire process proceeds in this manner, it is possible to obtain the composite substrate 1C which is stacked in an order of intermediate layer 30C and the semiconductor layer 20 on the supporting substrate 10C.

Modification Example 1 of Manufacturing Method of Composite Substrate 1C

In addition, in the above-described manufacturing method, the composite substrate 1C may be manufactured by the process described below. In addition, only the changed process will be described, and the process which is not changed will not be described and will not be illustrated in the drawings.

Figure 6:
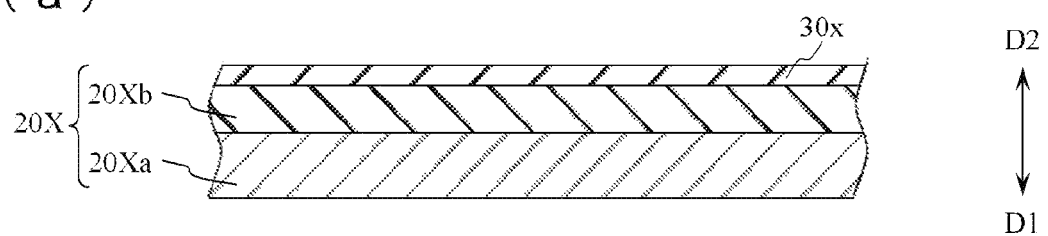
FIGS. 6(a) and 6(b) are cross-sectional views respectively illustrating a modification example of a manufacturing method of the composite substrate 1C.
Figure 6:
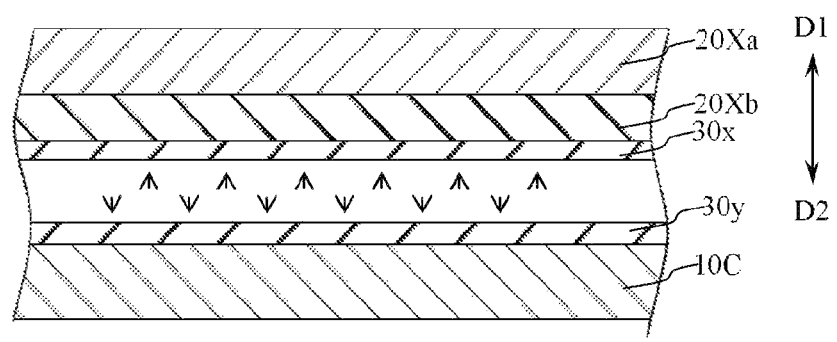

Instead of the process according to FIG. 4(b), as illustrated in FIG. 6(a), a first intermediate layer 30x is formed of a alumina on the upper surface of the Si film 20Xb in the D2 direction. Next, in the process of FIG. 4(c), the sapphire on the R surface is prepared as the supporting substrate 10C.

Instead of the process according to FIG. 5(a), as illustrated in FIG. 6(b), a part of the upper surface of the supporting substrate 10C is a second intermediate layer 30y which is activated. In this manner, the second intermediate layer 30y is made of γ alumina which follows the R surface single crystal sapphire surface.

As the first intermediate layer 30x and the second intermediate layer 30y are bonded to each other, both of these are matched with each other and the intermediate layer 30D in which the crystallinity is collapsed is formed.

In addition, in the above-described example, the second intermediate layer 30y is formed by being deformed a part of the supporting substrate 10, but the second intermediate layer 30y which is made of γ alumina may be newly formed on the supporting substrate 10C.

Modification Example 2 of Manufacturing Method of Composite Substrate 1C

Hereinafter, in the process illustrated in FIG. 4(b), an example in which the intermediate layer 30C is formed by the ALD method will be described.

In particular, the intermediate layer 30C is formed by alternately flowing on the surface of the substrate a trimethylaluminum (TMA) which has aluminum as a raw material and radical oxygen generated from $H_2O$ gas or oxygen gas, and by purging inert gas, such as Ar or the like, between the gases. The film is formed at approximately 0.1 [nm]/1 atomic layer forming cycle, and one cycle takes about several seconds. The thickness of the intermediate layer 30C may be approximately equal to or less than 20 [nm], but considering the relationship of the cycle time, the thickness may be formed to be equal to or less than 100 [nm].

Here, the film-forming temperature of the intermediate layer 30C in the ALD method is determined to be within the temperature range which is generally called an ALD window. Here, the ALD window means an intrinsic temperature range of a precursor (for example, TMA and H2O) which can obtain a uniform film thickness and is used in the ALD method. When the TMA and H2O are used, the temperature range can be from 200[° C.] to 400[° C.], for example.

In addition, in order to effectively radiate the heat generated from the semiconductor layer 20, it is preferable that the intermediate layer 30C be thin so as not to form the unnecessary parasitic capacitance. The thickness is determined according to an absolute amount of the metallic atoms which is incorporated into the bonding interface during the following process, but the thickness is equal to or less than 30 [nm], and more preferably, equal to or less than 5 [nm].

The intermediate layer 30C formed in this manner becomes a layer having many dangling bonds which is H-terminated on the inside, and becomes a film which is soft compared to a film manufactured by other thin film forming methods. For this reason, in the process illustrated in FIG. 5(a), it is possible to activate the surface of the bonding surface, and to use the bonding technique which realizes the bonding without heating and pressing.

Furthermore, in intermediate layer 30C formed as described above, there is less concern about the incorporation of the impurities compared to other thin film forming methods. According to this, it is possible to suppress the deterioration of the characteristic of the semiconductor layer 20 due to the presence of the unintended impurities.

Third Embodiment

Next, a composite substrate 1F according to a third embodiment will be described. Compared to the composite substrate 1C, the composite substrate 1F is different in that an intermediate layer 30F is provided. In addition, in the composite substrates 1F, the positional relationship between the supporting substrate 10, the intermediate layer 30F, and the semiconductor layer 20 is the same as that of the supporting substrate 10, the intermediate layer 30, and the semiconductor layer 20 in the composite substrate 1, as illustrated in FIG. 1. Hereinafter, only the differences will be described, and the repeating description will be omitted.

The intermediate layer 30F is disposed between the supporting substrate 10 and the semiconductor layer 20. One main surface of the intermediate layer 30F is directly bonded to the supporting substrate 10, and the other main surface is directly bonded to the semiconductor layer 20. The intermediate layer 30F has the oxide including the element contained in the semiconductor layer 20 as the main component. For example, the intermediate layer 30F has silicon oxide (SiO2) as the main component. The crystallinity of the intermediate layer 30F is low compared to that of the semiconductor layer 20.

Compared to the oxygen concentration per unit volume of the supporting substrate 10, the oxygen concentration per unit volume of the intermediate layer 30F may decrease. In this case, it is possible to suppress the combination of the metal and oxygen, and to suppress the movement according to the diffusion of the metal. The oxygen concentration may be achieved in the entire intermediate layer 30F, or may be achieved in a part of the intermediate layer 30F.

The intermediate layer 30F is composed of a polycrystal or an amorphous material. The thickness of the intermediate layer 30F is not particularly limited, but the maximum value of the thickness is set to be able to solid-dissolve the amount of the metal which causes a concern that the metal is incorporated by bonding the supporting substrate 10 and the semiconductor layer 20 to each other, which will be described later. However, a melting point of the silicon oxide is approximately 1700[° C.]. Even when the metal which will be described later exists on the interface between the intermediate layer 30F and the supporting substrate 10, the metal does not react to the element contained in the intermediate layer 30F, or is not encouraged to diffuse. For this reason, the above-described maximum value of the thickness is not necessarily required. In addition, when the thickness of the intermediate layer 30F may be equal to or less than 200 [nm], there is a concern that the heat radiation characteristic deteriorates due to the presence of the intermediate layer 30F. For this reason, the thickness of the intermediate layer 30F may be to an extent of 50 [nm], for example, and more preferably, the thickness may be approximately 30 [nm]. The thickness may be equal to or less than 5 [nm].

As the composite substrate 1F is configured in this manner, it is possible to suppress the diffusion or the deposition of the impurities to the semiconductor layer 20. Hereinafter, the reason thereof will be described.

The intermediate layer 30F is provided on the composite substrate 1F. The intermediate layer 30F is configured by the same material-based element as the element contained in the semiconductor layer 20. In other words, the intermediate layer 30F is a silicon oxide layer. The melting point of the silicon oxide is high, and the silicon oxide is not combined with the metal and does not encourage the diffusion of the metal even when the metal exists. For this reason, even when the metal exists on the interface between the supporting substrate 10 and the intermediate layer 30F, it is possible to maintain the metal between the supporting substrate 10 and the intermediate layer 30F, and as a result, it is possible to suppress the diffusion of the metal to the semiconductor layer 20.

In addition, the crystallinity of the intermediate layer 30F is low compared to that of the semiconductor layer 20 and the supporting substrate 10. For this reason, even if the metal exists, the metal does not diffuse to the semiconductor layer 20, and the metal diffuses and is solid-dissolved to the intermediate layer 30F via the grain boundary or the like.

Here, the evaluation of the crystallinity of the intermediate layer 30F, may be conducted by observing by using the transmission electron microscope (TEM), for example, after the cross-section processing by the focusing ion beam (FIB) processing, and by performing the electron beam diffraction. In addition, the crystallinity may be measured by the Rutherford backscattering (RBS).

As described above, according to the composite substrate 1F, it is possible to suppress the diffusion of the impurities, such as the metal, to the semiconductor layer 20, and to provide the semiconductor layer 20 having a high quality.

Modification Example of Composite Substrate 1F: Intermediate Layer G

Instead of the above-described intermediate layer 30F, an intermediate layer 30G having the oxygen concentration distribution in the thickness direction may be used.

Similarly to the intermediate layer 30A, in the intermediate layer 30G, the oxygen concentration decreases from the supporting substrate 10 toward the semiconductor layer 20 in the thickness direction. In this case, similarly to the intermediate layer 30A, the intermediate layer 30G can maintain the metal inside the intermediate layer 30G, and can suppress the diffusion to the semiconductor layer 20.

Modification Example of Composite Substrate 1F: Intermediate Layer 30H

Instead of the above-described intermediate layer 30F, an intermediate layer 30H which further includes the metallic element may be used.

Examples of the metallic element can include Fe, Cr, Ni, Cu, Zn, or the like. Here, as the metallic element, the element of the main component contained in the supporting substrate 10 and the semiconductor layer 20 is excluded. The content may be less than $1 \times 10^{15}$ [atoms/cm$^2$], for example.

The concentration of the metallic element in the intermediate layer 30H decreases from the supporting substrate 10 toward the semiconductor layer 20 in the thickness direction. According to this configuration, it is possible to reliably prevent the metallic element from diffusing to the semiconductor layer 20.

Manufacturing Method of Composite Substrate 1F

Next, a manufacturing method of the composite substrate 1F will be described by using the drawings.

Figure 7:
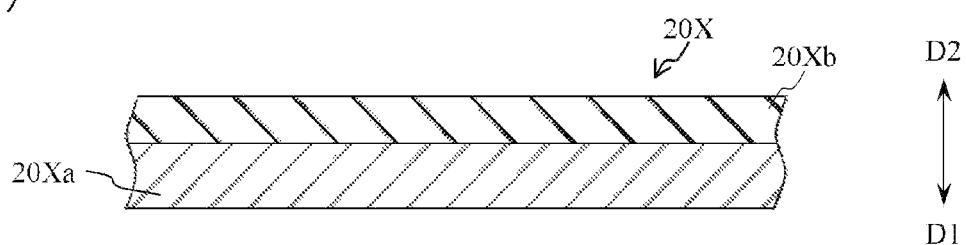
FIGS. 7(a) to 7(c) are cross-sectional views illustrating an example of a manufacturing process of a manufacturing method of a composite substrate 1F.
Figure 7:
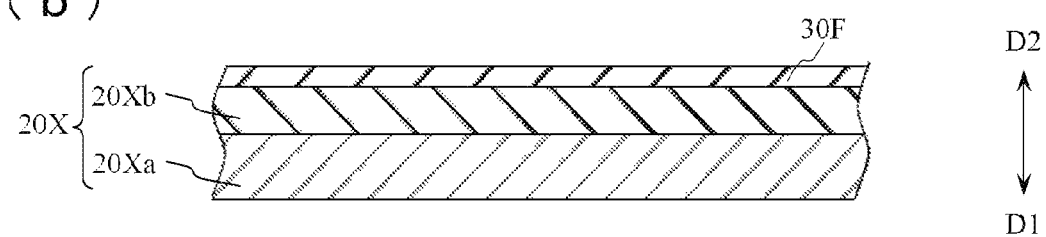
Figure 7:
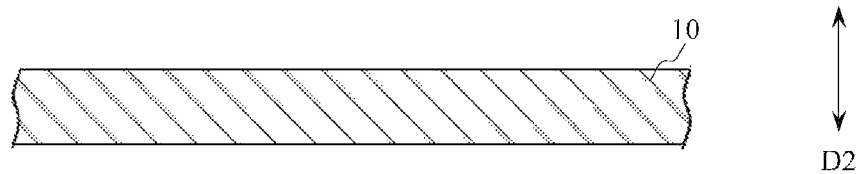

First, as illustrated in FIG. 7(a), the first substrate 20X is prepared similarly to in FIG. 2(a).

Next, as illustrated in FIG. 7(b), the intermediate layer 30F which is composed of the silicon oxide is formed on the upper surface of the Si film 20Xb in the D2 direction. The intermediate layer 30F uses, for example, the atomic layer deposition (ALD) method or the spattering method, in which the substrate is not required to be heated to a high temperature during the film-forming. It is preferable that the upper limit value of the specific film-forming temperature be a temperature which does not change the dopant concentration distribution in the Si film 20Xb, and be equal to or less than 500[° C.]. When the film is formed by the ALD method or the spattering method, since the substrate temperature is approximately from 200[° C.] to 400[° C.], the dopant concentration distribution does not change in the Si film 20Xb. In particular, when B is used as the dopant, compared to in a case where another element is used as the dopant, the diffusion is unlikely to occur, it is possible to more reliably suppress the dopant concentration distribution change due to the film-forming.

In the example, the film is formed by the ALD method. In particular, the intermediate layer 30F is formed by alternately flowing metal raw material gas on the surface of the substrate, such as tetramethylorthosilicate which includes silicon as a raw material, silicon tetrachloride, silicon hexachloride, TEOS, alkylsilane, alkoxysilane, aminosilane, alkoxysilane fluoride, or halogenated silane, and oxygen supplying gas, such as vapor which includes oxygen as a raw material or ozone gas, and by purging inert gas, such as Ar or the like, to between the gases.

In addition, the crystallinity of the intermediate layer 30F is not particularly limited. The crystallinity of the intermediate layer 30F may be lower than that of the Si film 20Xb which becomes the semiconductor layer 20 later, as a polycrystal or an amorphous material.

In this manner, the thickness of the intermediate layer 30F is not particularly limited, and can be within a range which is equal to or less than 100 [nm], for example. The thickness may be 50 [nm], for example. More preferably, the thickness may be equal to or less than 5 [nm].

Next, as illustrated in FIG. 7(c), the supporting substrate 10 is prepared similarly to in FIG. 2(b).

Figure 8:
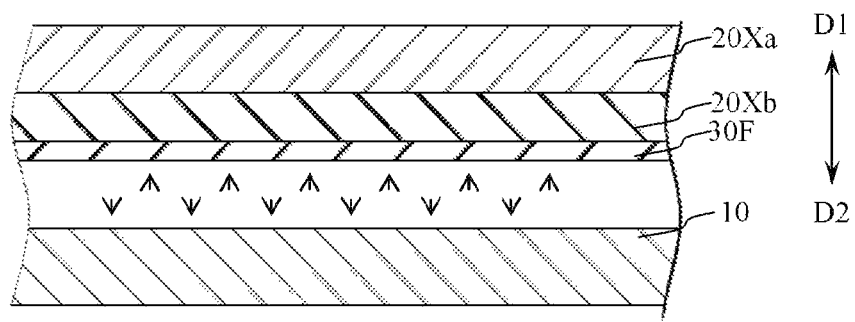
FIGS. 8(a) to 8(c) are cross-sectional views illustrating a manufacturing process after performing the process in FIG. 7.
Figure 8:
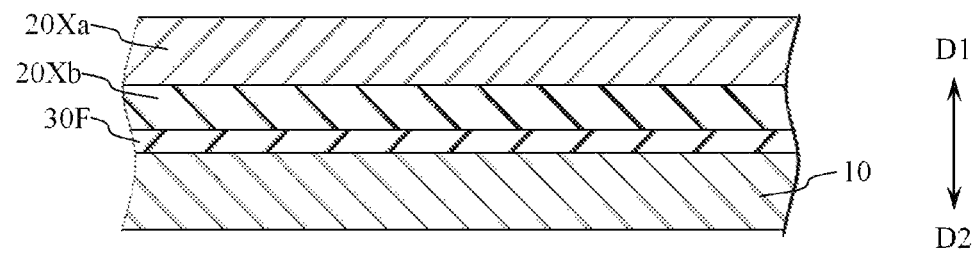
Figure 8:
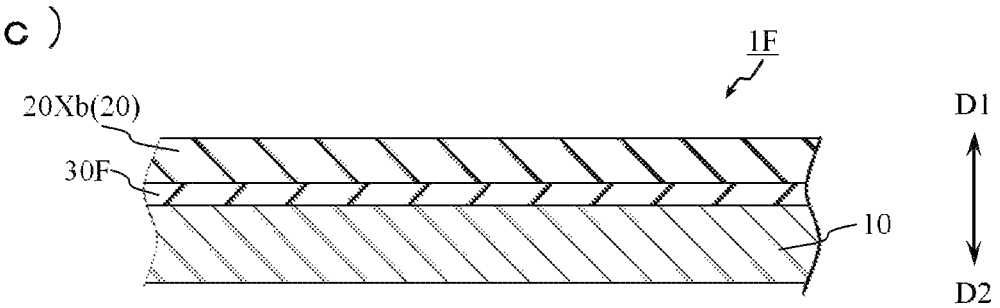

Next, the supporting substrate 10 and the main surface (main surface which is positioned on the side opposite to the single crystal silicon substrate 20Xa) of the first substrate 20X in the D2 direction are bonded to each other. In other words, the supporting substrate 10 and the main surface of the intermediate layer 30F are bonded to each other. As illustrated in FIGS. 8(a) and 8(b), examples of a method of bonding may be the same as the examples illustrated in FIGS. 5(a) and 5(b).

In this manner, when the bonding surfaces are brought into contact with each other after being activated, and are combined particularly at a room temperature, for example, even when the metal exists on the bonding surface, the diffusion and the deposition of the metal are not promoted. In addition, since the bonding is performed by activating the surface, the supporting substrate 10 and the intermediate layer 30F are not bonded to each other by a dehydration reaction like in the so-called SOI substrate. For this reason, a void of the bonding interface caused by the dehydration reaction does not occur. In addition, the configuration in which the water generated due to the dehydration reaction is absorbed is not required. Accordingly, it is possible to prevent the metal from diffusing to the semiconductor layer 20, and to enhance the reliability of the bonding of the semiconductor layer 20 and the supporting substrate 10.

In addition, the intermediate layer 30F does not require a film thickness which exceeds 200 [nm] which is necessary for absorbing the water generated due to the dehydration reaction, and can be thin. For this reason, it is possible to suppress the adverse effect on the radiation of the heat generated on the semiconductor layer 20.

As the process proceeds up to here, it is possible to make the intermediate product having the intermediate layer 30F and the Si film 20Xb between the supporting substrate 10 and the single crystal silicon substrate 20Xa.

Next, as illustrated in FIG. 8(c), similarly to in FIG. 3(b), the semiconductor layer 20 is obtained by making the first substrate 20X into a thin layer. As the entire process proceeds in this manner, it is possible to obtain the composite substrate 1F which is stacked in an order of intermediate layer 30F and the semiconductor layer 20 on the supporting substrate 10.

As the process proceeds in this manner, the surface of the supporting substrate 10 side of the semiconductor layer 20 which is formed by the epitaxial growth becomes the non-doped depleted layer, and the oxygen concentration decreases. In other words, the distortion of the surface of the supporting substrate 10 side of the semiconductor layer 20 becomes significantly small. This configuration is preferable since the stress or the like is not applied by the unintended distortion on the surface of the bonding side with the supporting substrate 10.

Furthermore, on the composite substrate 1F which is formed as the above-described process proceeds, the SiOx layer (oxide layer) which is formed by thermally oxidizing a part of the semiconductor layer 20 like the SOI substrate in the related art does not exist between the supporting substrate 10 and the semiconductor layer 20, particularly, on the semiconductor layer 20 side. According to this, it is possible to suppress the occurrence of the unintended stress which is required to form the SiOx layer, and an occurrence of interstitial Si or the like, in the semiconductor layer 20, and to improve the quality of the semiconductor layer 20.

According to the process, it is possible to limit the area which causes a concern about the incorporation of the metal, to the interface between the supporting substrate 10 and the intermediate layer 30F. In other words, when the supporting substrate 10 and the intermediate layer 30F are bonded to each other, it is possible to limit the metal which causes a concern about the incorporation to the bonding interface in a state where the bonding surface is activated. For this reason, by the presence of the intermediate layer 30F, it is possible to suppress the diffusion of the metal to the semiconductor layer 20.

Fourth Embodiment

Next, a composite substrate 1I according to a fourth embodiment will be described. Compared to the composite substrate 1C, the composite substrate 1I is different in that an intermediate layer 30I is provided. In addition, in the composite substrate 1I, the positional relationship between the supporting substrate 10, the intermediate layer 30I, and the semiconductor layer 20 is the same as that between the supporting substrate 10, the intermediate layer 30, and the semiconductor layer 20 of the composite substrate 1, as illustrated in FIG. 1. Hereinafter, only the differences will be described, and the repeating description will be omitted.

The intermediate layer 30I is disposed between the supporting substrate 10 and the semiconductor layer 20. The intermediate layer 30I has an element contained in the semiconductor layer 20 as the main component. For example, intermediate layer 30I has silicon (Si) as the main component. The crystallinity of the intermediate layer 30I is low compared to that of the semiconductor layer 20. The intermediate layer 30I has the element contained in the semiconductor layer 20 as the main component, but is configured to have a greater dissolved oxygen concentration than the semiconductor layer 20.

In particular, the intermediate layer 30I may be composed of a polycrystal or an amorphous material, and the crystallinity of the intermediate layer 30I may decrease by having many lattice defects per unit volume compared to the semiconductor layer 20. The comparison of the number of the lattice defects may use the result of converting to the number of the lattice defects per unit area and measuring by an etch pit density (EPD) method, for example. For example, an etch pit density measured by the EPD method of the intermediate layer 30I is higher than that of the semiconductor layer 20, and is approximately $10^3$ [/cm$^2$] to $10^6$ [/cm$^2$].

The thickness of the intermediate layer 30I is not particularly limited, but the maximum value of the thickness is set to be able to solid-dissolve the amount of the metal which causes a concern that the metal is incorporated by bonding the supporting substrate 10 and the semiconductor layer 20 to each other, which will be described later. However, a melting point of the semiconductor material is generally high compared to the melting point of the metal which will be described later. Even when the metal which will be described later exists on the interface between the intermediate layer 30I and the supporting substrate 10, the metal does not react to the element contained in the intermediate layer 30I, or is not encouraged to diffuse. For this reason, the above-described maximum value of the thickness is not necessarily required. For example, the thickness may be approximately 50 [nm]. More preferably, the thickness may be equal to or less than 10 [nm].

One main surface of the intermediate layer 30I is directly bonded to the supporting substrate 10, and the other main surface is directly bonded to the semiconductor layer 20. The boundary between the intermediate layer 30I and the semiconductor layer 20 can be determined by the difference in the number of the lattice defects per unit volume or the difference in the crystal structure. In particular, the number of the lattice defects per unit volume of the semiconductor layer 20 is less than $1 \times 10^3$ [/cm$^2$], and the area in which the number of the lattice defects per unit volume is equal to or higher than $1 \times 10^3$ [/cm$^2$] is the intermediate layer 30I. In addition, when the crystal structure varies, the semiconductor layer 20 is present up to the area which is the single crystal, and the intermediate layer 30I is present from the area in which the crystal structure is disturbed.

As the composite substrate 1I is configured in this manner, it is possible to suppress the diffusion or the deposition of the impurities to the semiconductor layer 20. Hereinafter, the reason thereof will be described.

The intermediate layer 30I is provided on the composite substrate 1I. The intermediate layer 30I is configured by the same material-based element as the element contained in the semiconductor layer 20. In other words, the intermediate layer 30I is an Si layer. The melting point of Si is high, and Si is not combined with the metal and does not encourage the diffusion of the metal even when the metal exists. For this reason, even when the metal exists on the interface between the supporting substrate 10 and the intermediate layer 30I, it is possible to maintain the metal between the supporting substrate 10 and the intermediate layer 30I, and as a result, it is possible to suppress the diffusion of the metal to the semiconductor layer 20.

In addition, the crystallinity of the intermediate layer 30I is low compared to that of the single crystal semiconductor layer 20. For this reason, even if the metal exists, the metal does not diffuse to the semiconductor layer 20, and the metal diffuses and is solid-dissolved to the intermediate layer 30I via a grain boundary or the like.

Here, the evaluation of the crystallinity of the intermediate layer 30I, may be performed by using the above-described EPD method if the evaluation is the comparison of the etch pit density, for example, or by using the Rutherford backscattering (RBS) method, the electron beam diffraction which uses the transmission electron microscope, an X-ray diffraction topography, or the like.

In addition to the description above, compared to the semiconductor layer 20, the oxygen concentration of the intermediate layer 30I in the embodiment is high. For this reason, it is possible to allow the intermediate layer 30I to function as a gettering layer which effectively maintains the metal in the intermediate layer 30I. In addition, here, the oxygen concentration of the semiconductor layer 20 is less than $1 \times 10^{16}$ [atoms/cm$^3$]. In this configuration, the diffusion, the solid dissolution, and the deposition of the metal to the semiconductor layer 20 is suppressed. In particular, when the metal is Fe, it is possible to suppress the occurrence of the OSF defect.

In addition, the intermediate layer 30I can also achieve a role as a stress relaxation layer. In particular, when the composite substrate 1I is heated, the metal which exists on the interface between the supporting substrate 10 and the intermediate layer 30I moves so that the stress generated due to the heat history is relaxed. Furthermore, as the moved metal is captured by the lattice defect, the grain boundary, the dangling bond, or the like, on the intermediate layer 30I, the metal does not move to the semiconductor layer 20.

In this manner, the intermediate layer 30I takes roles as a metal diffusion preventing layer and as the stress relaxation layer.

As described above, according to the composite substrate 1I, it is possible to suppress the diffusion of the impurities, such as the metal, to the semiconductor layer 20, and to provide the semiconductor layer 20 having a high quality.

Modification Example of Composite Substrate 1I: Intermediate Layer 30J

Instead of the above-described intermediate layer 30I, an intermediate layer 30J which is composed of polysilicon may be provided.

In a case where the intermediate layer 30J which is composed of polysilicon is used, when an element function portion which functions as the semiconductor device is formed on the semiconductor layer 20, it is possible to promptly transmit the heat generated at the element function portion to the supporting substrate 10 side without disturbing the operation.

In addition, even when the metal exists on the interface between the intermediate layer 30J and the supporting substrate 10, it is possible to maintain the metal at the grain boundary which has countless polysilicon by the intermediate layer 30J. Accordingly, it is possible to effectively suppress the diffusion of the metal to the semiconductor layer 20.

In addition, as the intermediate layer 30J is composed of polysilicon, when a residual stress is generated due to the following heat history, preferably, the stress is relaxed by moving the metal to the grain boundary at a desired position according to the generated residual stress.

Modification Example of Composite Substrate 1I: Intermediate Layer 30K

Instead of the above-described intermediate layer 30I, an intermediate layer 30K which further contains the metal may be used.

Examples of the metallic element can include Fe, Cr, Ni, Cu, Zn, or the like. The content may be less than $1 \times 10^{15}$ [atoms/cm$^3$].

In the intermediate layer 30k, the metallic elements exist at the grain boundary of polysilicon.

The concentration of the metallic elements in the intermediate layer 30k decreases from the supporting substrate 10 toward the semiconductor layer 20 in the thickness direction. According to this configuration, it is possible to reliably prevent the metallic element from diffusing to the semiconductor layer 20.

Manufacturing Method of Composite Substrate 1I

Next, a manufacturing method of the composite substrate 1I will be described with reference to the drawings.

Figure 9:
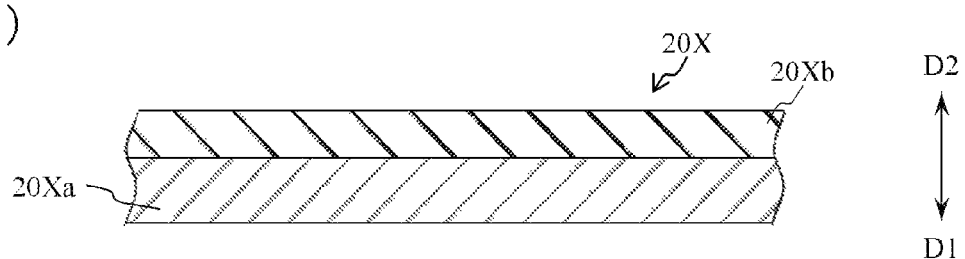
FIGS. 9(a) to 9(c) are cross-sectional views illustrating an example of a manufacturing process of a manufacturing method of a composite substrate 1I.
Figure 9:
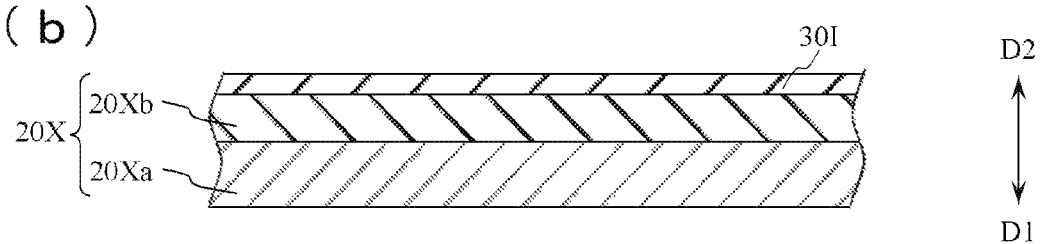
Figure 9:
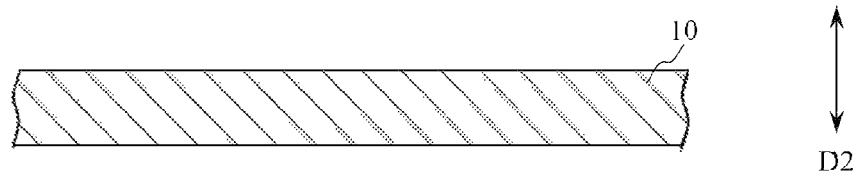

First, as illustrated in FIG. 9(a), the first substrate 20X is prepared similarly to in FIG. 2(a).

Next, as illustrated in FIG. 9(b), the intermediate layer 30I which is composed of the silicon is formed on the upper surface of the Si film 20Xb in the D2 direction. The intermediate layer 30I may be formed, for example, by the atomic layer deposition (ALD) method, a CVD method, or a spattering method. The intermediate layer 30I may be formed by a method of recrystallizing by performing the heat treatment after forming polysilicon by the growth at a low temperature. Even by recrystallizing the amorphous-shaped film after performing the following room temperature bonding, it is possible to obtain a desired intermediate layer.

First, as illustrated in FIG. 9(c), the supporting substrate 10 is prepared similarly to in FIG. 2(b).

Figure 10:
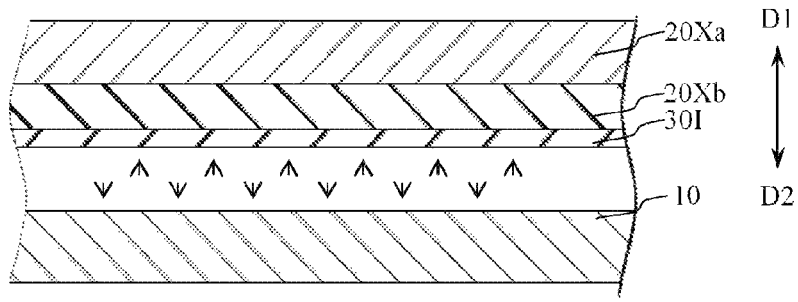
FIGS. 10(a) to 10(c) are cross-sectional views illustrating a manufacturing process after performing the process in FIG. 9.
Figure 10:
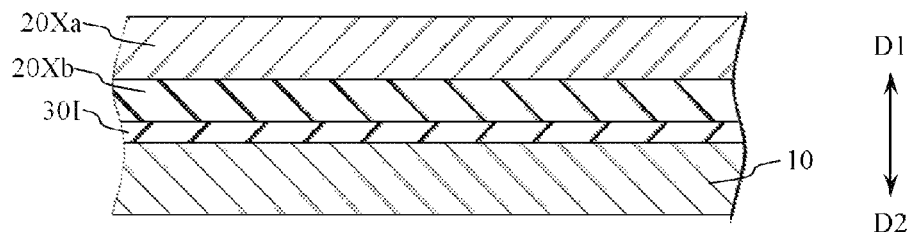
Figure 10:
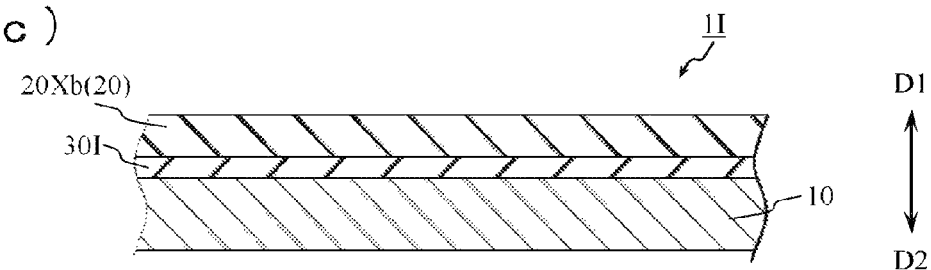

Next, the supporting substrate 10 and the main surface (main surface which is positioned on the side opposite to the single crystal silicon substrate 20Xa) of the first substrate 20X in the D2 direction are bonded to each other. In other words, the supporting substrate 10 and the main surface of the intermediate layer 30I are bonded to each other. Examples of a method of bonding, as illustrated in FIG. 10(a), include a method of bonding by activating the surface of the bonding surface, and a method of bonding by using the electrostatic force. Examples of a method of activating the surface include a method of activating by irradiating the surface with the ion beam or the neutron beam in a vacuum and etching the surface, and a method of activating by etching the surface by the chemical solution.

As illustrated in FIG. 10(b), both of these are bonded to each other in the activated state similarly to in FIG. 3(a). The bonding may be performed at a room temperature. In addition, the bonding may be performed by a method in which the adhesive, such as the resin-based adhesive, is not used.

As the process proceeds up to here, it is possible to make the intermediate product having the intermediate layer 30I and the Si film 20Xb between the supporting substrate 10 and the single crystal silicon substrate 20Xa.

Next, as illustrated in FIG. 10(c), similarly to in FIG. 3(b), the semiconductor layer 20 is obtained by making the first substrate 20X into a thin layer by processing the intermediate product from an arrow D2 direction (single crystal silicon substrate 20Xa side). As the entire process proceeds in this manner, it is possible to obtain the composite substrate 1I which is stacked in an order of the intermediate layer 30I and the semiconductor layer 20 on the supporting substrate 10.

According to the process, it is possible to limit the area which causes a concern about the incorporation of the metal, to the interface between the supporting substrate 10 and the intermediate layer 30I. In other words, when the supporting substrate 10 and the intermediate layer 30I are bonded to each other, it is possible to limit the metal which causes a concern about the incorporation to the bonding interface in a state where the bonding surface is activated. For this reason, by the presence of the intermediate layer 30I, it is possible to suppress the diffusion of the metal to the semiconductor layer 20.

Modification Example of First to Fourth Embodiments

On the intermediate layers 30B, 30E, 30H, and 30K, it is preferable that a density per unit surface area in a vicinity of the surface of the supporting substrate 10 side of the metallic atoms be equal to or less than $10^{12}$ [atoms/cm$^2$]. By setting the density to that described above in the metallic atoms, the atomic arrangement of the element existing on the bonding surface is exposed without covering the bonding surface. In other words, according to the intermediate layer 30B, without covering one main surface of the supporting substrate 10 and one main surface of the semiconductor layer 20, the atomic arrangement of the elements which constitute one main surface of the supporting substrate 10 and one main surface of the semiconductor layer 20 is exposed. According to the intermediate layers 30E, 30H, and 30K, one main surface (bonding surface) of the supporting substrate 10 and a main surface (bonding surface) of the intermediate layers 30E, 30H, and 30K are exposed.

Here, the density of the metallic atoms represents the number of atoms per unit surface area. Practically, a part of the intermediate layers 30B, 30E, 30H, and 30K, and semiconductor layer 20 on the supporting substrate 10 is dissolved into a constant volume of an etching solution by an inductively coupled plasma mass spectrometry (ICP-MS), the amount of the metallic atoms is measured, and the density in a surface direction is calculated on the assumption that the entire amount of the metallic element exists within 5 nm of a thickness from the interface. The assumption is made as it is confirmed that the metallic atoms exist in an area within 5 nm of the supporting substrate 10 side among 30B, 30E, 30H, and 30K, and rarely diffuses into the semiconductor layer 20, even when the metal amount is the largest as a result of observing and measuring the distribution state of the metallic atoms in the thickness direction with regard to the plurality of composite substrates obtained in the embodiment.

In this manner, the vicinity in the intermediate layers 30B, 30E, 30H, and 30K represents an area having 5 nm of thickness from the surface of the side which is in contact with the supporting substrate 10.

As the density of the metallic atoms is equal to or less than $10^{12}$ atoms/cm$^2$, first, while retaining the bonding, it is possible to suppress the occurrence of a deposition portion of the metallic atoms on the interface. The mechanism will be described in detail. In order to control the density of the metallic atoms to be low, it is possible to adjust by using a neutron beam (FAB) gun in the activating process, by making the atmosphere into a high vacuum state during the bonding, or by coating the component in a vacuum with an insulating material.

In a case where the metallic atoms are aggregated between the supporting substrate 10 and the semiconductor layer 20, when the semiconductor device is built on the semiconductor layer 20, there is a concern about an adverse effect on the operation of the semiconductor device. When the metallic atoms are provided in a layer shape or in an island shape on the interface (for example, the density of the metallic atoms on the interface is approximately equal to or greater than $3.0 \times 10^{16}$ [atoms/cm$^2$]), the aggregation of the metallic atoms is a naturally assumed problem. However, even when the density is approximately less than $3.0 \times 10^{16}$ [atoms/cm$^2$], in a case where the density exceeds $10^{12}$ [atoms/cm$^2$], the metallic atoms are aggregated during the process of adding the heat treatment for building the semiconductor device even though the metallic atoms diffused to the bonding surface during the bonding and the existence of the metallic atoms cannot be recognized. However, as the density is equal to or less than $10^{12}$ [atoms/cm$^2$], it is possible to prevent the metallic atoms from being aggregated even when the heat treatment is added to the composite substrate 1.

Although the mechanism is not apparent, it can be considered that solid solubility of the metallic atoms are related to the element contained in the semiconductor layer 20 or the supporting substrate 10. In other words, since the density of the metallic atoms is equal to or greater than $10^{10}$ [atoms/cm$^2$] and equal to or less than $10^{12}$ [atoms/cm$^2$], the density does not bring the metallic atoms into contact with each other and make an aggregate, and the mobility is also low at a room temperature. For this reason, the aggregate is not formed during the bonding. Additionally, even when the mobility increases by adding the heat treatment, the metallic atoms exist only to an extent of 10 times the solid solubility in a case of the density. Accordingly, even in this state, it can be considered that the aggregate is not formed.

Furthermore, most of the metallic atoms are solid-dissolved into the element which constitutes the semiconductor layer 20 or the supporting substrate 10, and the residual metallic atoms also are not present in an amount sufficient for promoting the diffusion to the semiconductor layer 20.

In addition, in a case where the semiconductor layer 20 is composed of Si and the metallic atoms include Fe, if the density thereof is greater than $10^{12}$ [atoms/cm$^2$], the OSF defect rapidly increases with the value as a border. The lattice defect is one of the reasons for the OSF defect, and there is a possibility that the compound of Fe and O becomes the OSF defect by being moved and deposited to the surface by using the lattice defect a foothold. The threshold value of the abundance of Fe which generates the OSF defect and the upper limit value of the density of the metallic atoms in the embodiment match each other.

The OSF defect and the aggregation of the metal are not directly related to each other, but when focusing attention on a phenomenon in which the metallic atoms are moved, aggregated, and deposited in the semiconductor layer, there is a common point between the OSF defect and the aggregation of the metal. Here, when considering factors which are the presence of the defect and the combination of the metal (Fe) and the oxygen that are causes of the occurrence of the OSF defect, the composite substrate 1 of the embodiment directly bonds the semiconductor layer 20 and the supporting substrate 10 by activating the bonding surface therebetween and by forming the dangling bond. According to this, there is a possibility that the dangling bond remains on the bonding interface as the defect. In addition, because of the heat treatment performed for forming the semiconductor device after bonding, there is a possibility that the metallic atoms on the bonding interface and the element contained in the semiconductor layer 20 and the supporting substrate 10 form an intermetallic compound. The two assumptions, that is, the assumptions that the defect on the interface and the metallic atoms which form the intermetallic compound exist on the interface at the same time mean that the two causes of the occurrence of the OSF defect are satisfied. Accordingly, the composite substrate 1 of the embodiment suggests a possibility of the movement and the deposition of the metallic atoms by using the defect of the interface as the foothold, similarly to a case of the OSF defect generated as Fe which uses the defect as the foothold is moved and deposited. According to the above, by setting the density of the metallic atoms to be equal to or less than the threshold value which generates the OSF defect, it can be assumed that the diffusion and the aggregation of the metallic atoms can be suppressed.

In particular, it is preferable that the oxygen concentration of the intermediate layers 30B, 30E, 30H, and 30K decrease as approaching the semiconductor layer 20 and be lowered to less than $10^{18}$ [atoms/cm$^3$] which is the oxygen concentration of the semiconductor layer 20. Accordingly, it is difficult to combine oxygen to promote the diffusion and the movement, and it is possible to more reliably suppress the diffusion of the metal to the semiconductor layer 20. Accordingly, when the semiconductor device is built on the composite substrate 1, it is possible to provide the composite substrate 1 which includes the semiconductor layer 20 having a high reliability without the OSF defect.

In addition, the lower limit value of the density of the metallic atoms is not particularly limited, but is the required amount for bonding the supporting substrate 10 and the semiconductor layer 20 at a room temperature. In particular, when the density of the metallic element is equal to or greater than $10^{10}$ [atoms/cm$^2$] during the bonding, it is confirmed that the same bonding strength as in a case where the bonding is performed in a state where the metallic amount is large can be ensured following Japanese Patent No. 4162094.

Above, according to the modification example, it is possible to provide the composite substrate 1 which is provided with the semiconductor layer 20 which suppresses the diffusion of the metal and has a sufficient bonding strength between the supporting substrate 10 and the semiconductor layer 20.

Modification Example of First to Fourth Embodiments

It is preferable that the R surface of the sapphire substrate be used as the supporting substrate 10. By using the R surface, it is possible to greatly expose Al which is one of the metallic atoms on the intermediate layer 30 side. Accordingly, it is possible to suppress the supply of the unintended oxygen to the intermediate layer 30, to increase the ratio of the combination of Al and Si which are the metallic atoms by the following heating process or the like, and to realize stronger bonding.

Modification Example of First to Fourth Embodiments

On the intermediate layers 30B, 30E, 30H, and 30K, the metallic elements may form metal silicide or metal oxide. Examples thereof include SiFeOx, AlFeOx, or the like.

In order to allow the metallic atoms contained in the metallic element to exist as the intermetallic compound, such as the metal silicide or the metal oxide, the heat treatment is performed at 500° C. or greater for 0.5 [time] or longer after performing the bonding process and making the semiconductor layer 20 so as to be a thin layer, and the element contained in the semiconductor layer 20 and the element contained in the supporting substrate 10 are combined. Accordingly, the intermetallic compound is generated.

Here, when the metallic amount (metallic amount in the vicinity of the interface with the intermediate layers 30B, 30E, 30H, and 30K) which exists on the bonding interface between the intermediate layers 30B, 30E, 30H, and 30K, and the supporting substrate 10 is equal to or less than $10^{12}$ [atoms/cm$^2$], the composite substrate 1 can suppress the diffusion and the aggregation of the metallic atoms. For this reason, even when the metallic element exists as the intermetallic compound, the metallic element remains on the bonding interface between the intermediate layers 30B, 30E, 30H, and 30K, and the supporting substrate 10. When the metallic element forms the intermetallic compound, a vacancy which is supplied to the combination of the element contained in the semiconductor layer 20 with the metallic element, and a vacancy which is supplied to the combination of the element contained in the supporting substrate 10 with the metallic element, are generated in the vicinity. When the vacancy is the defect and new impurities exist on the interface, the gettering of the impurities can be performed, and the diffusion to the semiconductor layer 20 can be suppressed.

Modification Example of Second to Fourth Embodiments

Oxide Layer

Figure 11:
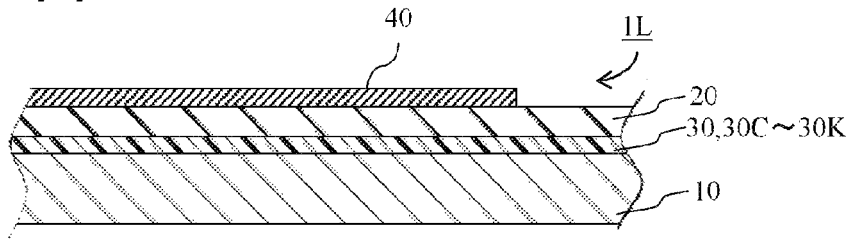
FIG. 11 is a partial cross-sectional view of a composite substrate 1L according to another embodiment of the invention.

As illustrated in FIG. 11, in the above-described embodiment, an oxide layer 40 may be formed on the upper surface of the semiconductor layer 20. In other words, among the main surfaces of the semiconductor layer 20, the oxide layer 40 may be formed on the surface on the side opposite to the side which is in contact with the intermediate layers 30C to 30K.

The oxide layer 40 may be formed by thermally oxidizing the semiconductor layer 20. In this manner, when a part of the semiconductor layer 20 is oxidized and becomes the oxide layer 40, according to a volume change, Si is pushed out to the residual part as the semiconductor layer 20 from the oxide layer 40 side, interstitial Si increases in the vicinity of the surface of the oxide layer 40 side of the semiconductor layer 20, and thus, Si atom density per unit volume increases.

In contrast, since the intermediate layers 30C to 30K between the semiconductor layer 20 and the supporting substrate 10 are formed by newly being film-formed on the main surface of the semiconductor layer 20, the amount of the Si atom does not increase in the vicinity of the intermediate layer 30 side of the semiconductor layer 20. Here, it is known that the existence of interstitial Si is the reason for the promotion of the occurrence of the OSF defect. In the composite substrate 1, the part to which the metal element that is the cause of the OSF defect is incorporated, is a part between the supporting substrate 10 and the semiconductor layer 20, in which the center is a part between the supporting substrate 10 and the intermediate layers 30C to 30K. As the Si atom density per unit volume, which illustrates an interstitial Si concentration in the vicinity, decreases compared to the surface of the oxide layer 40 side, it is possible to suppress the occurrence of the OSF defect.

Furthermore, as interstitial Si of another part of the semiconductor layer 20 is smaller than in the vicinity of the surface of the oxide layer 40 side of the semiconductor layer 20, it is possible to suppress the generation of the tensile strain on the crystal structure on the semiconductor layer 20, and to suppress the influence to a carrier mobility of the semiconductor device.

In this manner, it is possible to assume the distortion amount by interstitial Si or the like by forming the semiconductor device on the semiconductor layer 20 and measuring the carrier mobility or the like.

In addition, the vicinity of the surface of the side which is in contact with the oxide layer 40 of the semiconductor layer 20 represents an area which continues to a lower side from the oxide layer 40 side and has a thickness of approximately 5 [nm]. The vicinity of the surface of the side which is in contact with the intermediate layers 30C to 30K of the semiconductor layer 20 represents an area which continues to an upper side from the intermediate layer 30 and has a thickness of approximately 5 [nm].

Electronic Component

In addition, on the composite substrate 1 of the above-described embodiment and the modification example thereof, electronic components may be formed by forming a plurality of element parts and dividing the composite substrate 1 to include at least one element part.

Figure 12:
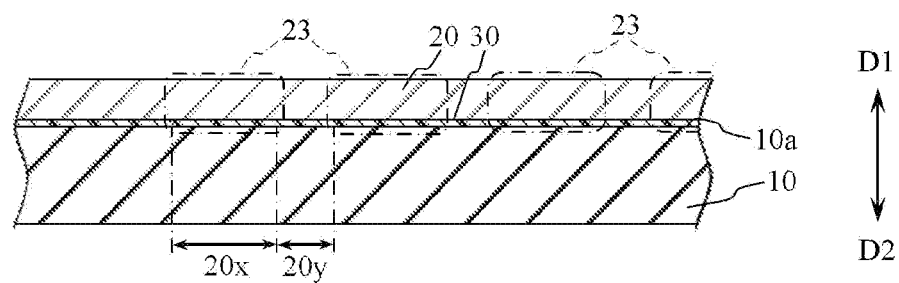
FIGS. 12(a) and 12(b) are cross-sectional views illustrating a manufacturing process after performing the process in FIG. 3.
Figure 12:
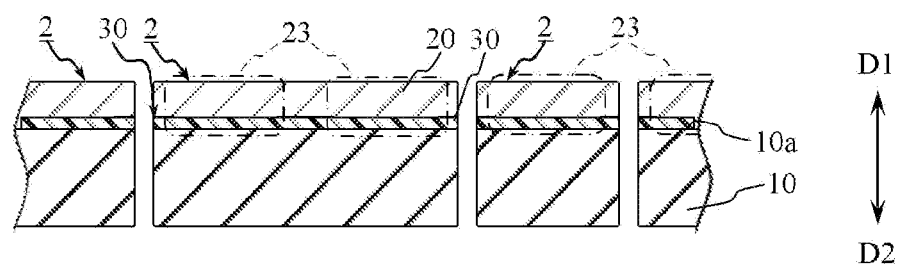

In particular, as illustrated in FIG. 12(a), an element part 23 is formed from an upper surface side of the semiconductor layer 20 of the obtained composite substrate 1. Examples of the element part 23 include various semiconductor device structures.

Next, as illustrated in FIG. 12(b), electronic components 2 are manufactured by dividing the composite substrate 1 on which the element part 23 is formed. When the composite substrate 1 is divided into the electronic components 2, at least one element part 23 is included in one electronic component 2. In other words, a plurality of element parts 23 may be included in one electronic component 2.

As described above, it is possible to manufacture the electronic component 2 having the element part 23.

EXAMPLE

Figure 13:
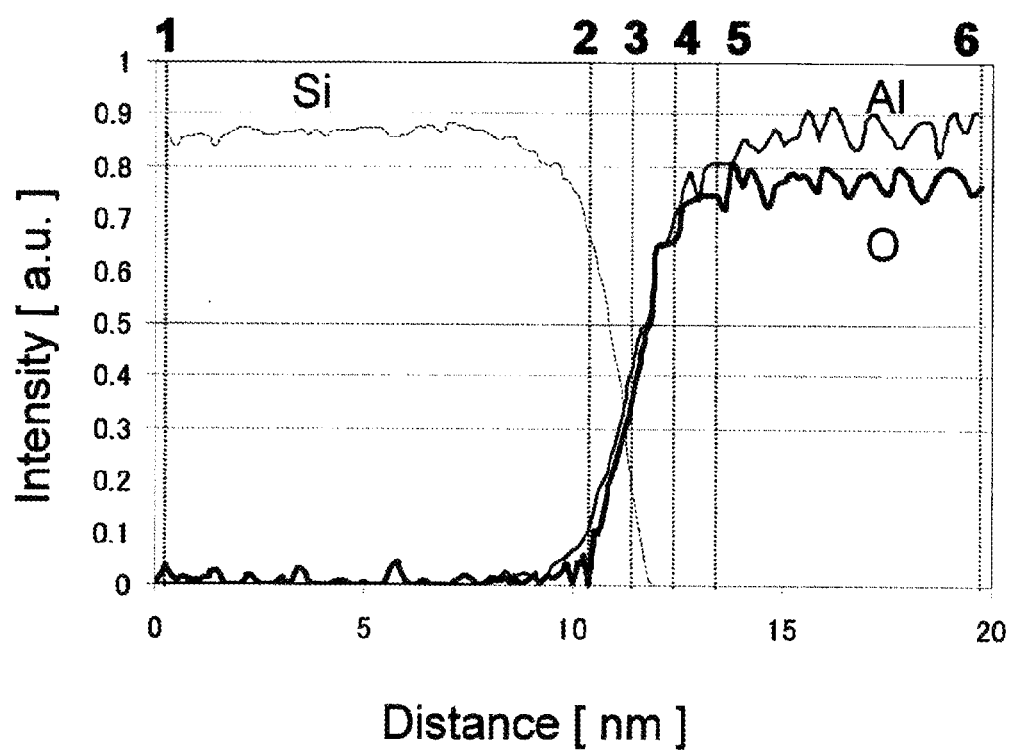
FIG. 13 is a diagram illustrating an interrelationship between a depth direction and an element existence amount of the composite substrate 1A.

According to the manufacturing method illustrated in FIGS. 2 and 3, the composite substrate 1A which formed the intermediate layer 30A having a thickness of 5 [nm] between the supporting substrate 10 and the semiconductor layer 20 was manufactured. In the composite substrate 1A, the cross section which includes the intermediate layer 30A was formed by performing the focusing ion beam (FIB) processing, and the composition from the semiconductor layer 20 side to the intermediate layer 30 and the supporting substrate 10 was analyzed by EDS. In addition, a line analysis was performed regarding the composition from the semiconductor layer 20 side to the intermediate layer 30A and the supporting substrate 10, by an electron energy loss spectroscopy (EELS). The result thereof is illustrated in FIG. 13. FIG. 13 is a diagram which illustrates a state of change in the existence amount of oxygen, aluminum, and silicon with respect to the depth direction. The vertical axis illustrates a measured intensity of each standardized element, and the horizontal axis illustrates a depth [nm] from the semiconductor layer 20 side. In the drawing, in an order from the thickest line, an oxygen intensity, an aluminum intensity, and a silicon intensity are illustrated.

As illustrated in FIG. 13, it was possible to recognize a state where the oxygen concentration in the intermediate layer 30A decreases from the supporting substrate 10 toward the semiconductor layer 20. Accordingly, it was possible to recognize that the oxygen concentration on the intermediate layer 30B decreases from the supporting substrate 10 toward the semiconductor layer 20.

As a result of TEM observation of the cross section which was similarly manufactured by the FIB processing, it was recognized that the crystallinity of the intermediate layer 30A is low compared to that of the supporting substrate 10 and the semiconductor layer 20.

Figure 14:
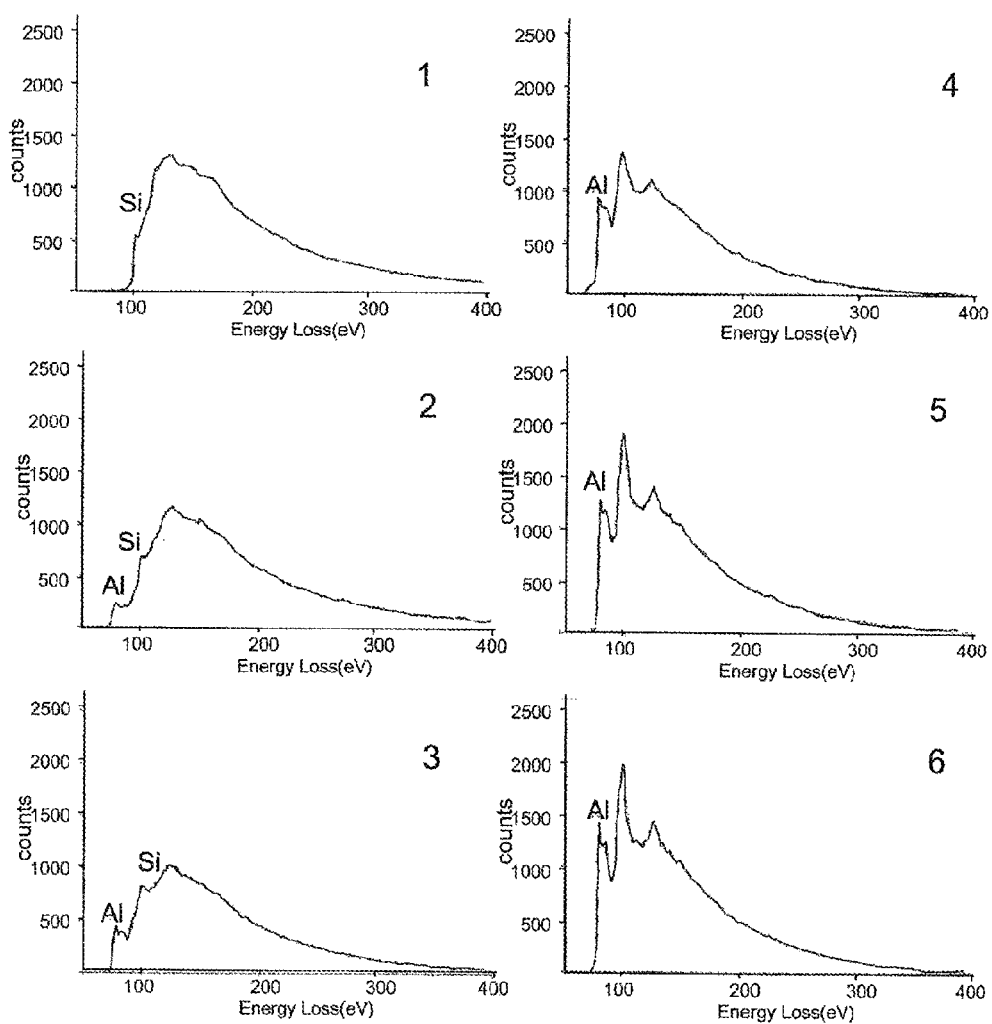
FIG. 14 is a view in which a chemical combination state is measured at each depth position in FIG. 13.

At depth positions 1 to 6 illustrated in FIG. 13 of the cross section which was similarly manufactured by the FIB processing, the confirmation was performed by the EELS. The result thereof is illustrated in FIG. 14. As a result of determination of the combination state based on the measured combining energy data, combinations other than Si—Si and Al—O were not recognized. Accordingly, it was recognized that the element contained in the supporting substrate 10 and the element contained in the semiconductor layer 20, both exist individually at the intermediate layer 30A.

Furthermore, a tension test of the composite substrate 1A was performed by using Romulus manufactured by QUAD-GROUP. As a result, it was recognized that the bonding strength of the composite substrate 1A was equal to or greater than 14.7 MPa, and the composite substrate 1A which is configured via the intermediate layer 30B was bonded well. In addition, it was recognized that the composite substrate 1A maintained the bonding state even when various processes, such as semiconductor device processing according to the polishing, the heating, the cutting, or the like, proceeded, and the composite substrate 1A had sufficient bonding strength.

Figure 15:
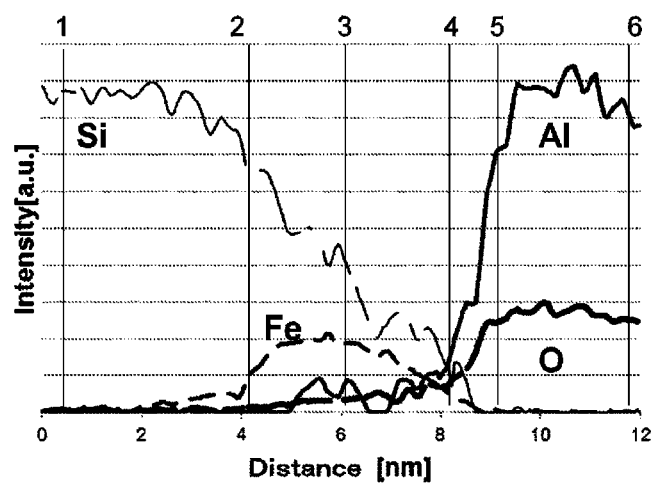
FIGS. 15(a) and 15(b) are a diagram illustrating an interrelationship between a depth direction and an element existence amount of a composite substrate having an intermediate layer 30B, and a view in which a chemical combination state is measured at a depth position 3, respectively.
Figure 15:
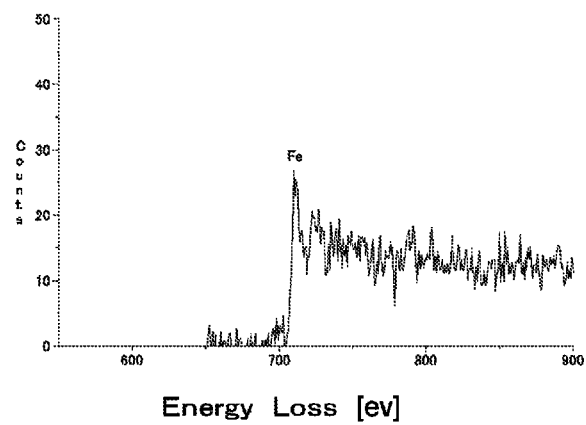

In addition, instead of the intermediate layer 30A, a composite substrate which is provided with the intermediate layer 30B having Fe was manufactured, and the measurement was performed similarly. The result thereof is illustrated in FIG. 15. FIG. 15(a) is a diagram illustrating a result of the line analysis regarding the composition from the semiconductor layer 20 side to the intermediate layer 30B and the supporting substrate 10A by the EELS. FIG. 15(b) is a diagram in which the combination state of Fe was specifically described by the EELS at the depth position 3 among the depth positions illustrated in FIG. 15(a). As a result, the metal which mainly has a slight amount of Fe on the bonding interface exists, but the metals were not combined with any of Al, Si, and O, and the diffusion to the semiconductor layer 20 was not recognized. In addition, it was not recognized that Fe was combined with Si, Al, or O, that is, Fe exists as an elemental substance. In addition, although not illustrated in the drawing, combinations other than Si—Si and Al—O were not recognized as a result of a state analysis regarding Si, Al, and O by the EELS at each depth position in FIG. 15(a).

Modification Example of Manufacturing Method

In addition, in the above-described manufacturing method, the composite substrate 1 may be manufactured by the process below. In addition, only the changed process will be described, and the process which is not changed will not be described.

In the above-described process, an example in which the intermediate layer 30 is formed to have a low crystallinity compared to the supporting substrate 10 or the semiconductor layer 20 is described, but an intermediate layer 30Z composed of the single crystal may be formed by using an MBE method in the Si film 20Xb. In this case, it is possible to reliably fix and lock the metallic atoms between the supporting substrate 10 and the intermediate layer 30Z which are composed of the single crystal. In addition, after forming the intermediate layer 30Z composed of the single crystal, the crystallinity of a part thereof may be collapsed. In other words, an area in which the crystallinity deteriorates may be provided in the middle of the intermediate layer 30Z.

REFERENCE SIGNS LIST

1 Composite substrate
10 Supporting substrate
20 Semiconductor layer
30 Intermediate layer

The invention claimed is:
1. A composite substrate, comprising:
a supporting substrate that is composed of a single crystal sapphire;
a semiconductor layer that is composed of a single crystal, a main surface of the semiconductor layer bonded to the supporting substrate; and
an intermediate layer that is composed of a polycrystal or an amorphous alumina, disposed between the supporting substrate and the semiconductor layer, a first surface of the intermediate layer being directly bonded to the supporting substrate, a second surface of the intermediate layer being directly bonded to the semiconductor layer, the intermediate layer including a main component that is an element constituting the supporting substrate and a sub-component, which is other than the main component and is less than 1 mass %, wherein
the intermediate layer includes a metallic element as the sub-component that is different from the element contained in the supporting substrate and the element contained in the semiconductor layer and a density of the metallic element in a vicinity of an interface with the supporting substrate is equal to or greater than $1\times10^{10}$ atoms/cm$^2$ and equal to or less than $1\times10^{12}$ atoms/cm$^2$, a concentration of the metallic element in the vicinity is greater than a concentration of the metallic element in an area of the intermediate layer which area is positioned on a semiconductor layer side compared to the vicinity in a thickness direction of the intermediate layer.

2. The composite substrate according to claim 1, wherein the oxygen concentration of the semiconductor layer is less than $10^{18}$ atoms/cm$^3$.

3. The composite substrate according to claim 1, wherein the semiconductor layer is composed of silicon single crystal.

4. The composite substrate according to claim 1, wherein a concentration of the metallic element decreases from the supporting substrate toward the semiconductor layer in the thickness direction.

5. The composite substrate according to claim 1, wherein a thickness of the intermediate layer is equal to or less than 50 nm.

6. The composite substrate according to claim 1, wherein the metallic element is Fe.

7. The composite substrate according to claim 1, wherein the intermediate layer is a monolayer.

8. A composite substrate, comprising:
a supporting substrate that is composed of a single crystal of an insulating oxide;
a semiconductor layer that is composed of a single crystal, a main surface of the semiconductor layer bonded to the supporting substrate; and
an intermediate layer that is composed of a polycrystal or an amorphous material, disposed between the supporting substrate and the semiconductor layer, and includes a main component that is an element constituting the supporting substrate and a sub-component, which is other than the main component and is less than 1 mass %, wherein the intermediate layer includes the element constituting the supporting substrate as the main component, the supporting substrate is sapphire, the intermediate layer is composed of the polycrystal which includes alumina as a main component, and a ratio of γ-alumina increases toward the supporting substrate and a ratio of α-alumina increases toward the semiconductor layer in the thickness direction.

9. The composite substrate according to claim 8, wherein the intermediate layer includes a metallic element as the sub-component that is different from the element contained in the supporting substrate and the element contained in the semiconductor layer and a density of the metallic element in a vicinity of the interface with the supporting substrate is equal to or less than $1\times10^{12}$ atoms/cm$^2$.

10. The composite substrate according to claim 8, wherein a thickness of the intermediate layer is equal to or less than 50 nm.

11. The composite substrate according to claim 8, wherein the intermediate layer includes Fe as the sub-component.

* * * * *